(12) United States Patent
Li et al.

(10) Patent No.: US 12,307,104 B2
(45) Date of Patent: May 20, 2025

(54) NON-VOLATILE MEMORY WITH SECURE ERASE

(71) Applicant: Western Digital Technologies, Inc., San Jose, CA (US)

(72) Inventors: Liang Li, Shanghai (CN); Ming Wang, Shanghai (CN); Jiahui Yuan, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 91 days.

(21) Appl. No.: 18/359,819

(22) Filed: Jul. 26, 2023

(65) Prior Publication Data

US 2024/0338131 A1 Oct. 10, 2024

Related U.S. Application Data

(60) Provisional application No. 63/495,257, filed on Apr. 10, 2023.

(51) Int. Cl.
*G06F 3/06* (2006.01)
*G06F 12/02* (2006.01)

(52) U.S. Cl.
CPC .......... *G06F 3/0623* (2013.01); *G06F 3/0652* (2013.01); *G06F 3/0679* (2013.01); *G06F 12/0292* (2013.01); *G06F 2212/1052* (2013.01); *G06F 2212/2022* (2013.01)

(58) Field of Classification Search
CPC .... G06F 3/0623; G06F 3/0652; G06F 3/0679; G06F 12/0292; G06F 2212/1052; G06F 2212/2022; G06F 2212/1032; G06F 2212/7205; G06F 2212/7208; G06F 12/0246; G11C 11/5628; G11C 11/5635; G11C 16/0483; G11C 16/16; G11C 16/08; G11C 16/3445
See application file for complete search history.

(56) References Cited

U.S. PATENT DOCUMENTS

| | | | |
|---|---|---|---|
| 6,638,821 B1 * | 10/2003 | Hsieh | H10B 69/00 438/257 |
| 7,495,954 B2 | 2/2009 | Ito | |
| 7,965,554 B2 * | 6/2011 | Lutze | G11C 16/3418 365/185.17 |
| 8,634,248 B1 * | 1/2014 | Sprouse | G11C 11/5642 365/185.17 |
| 9,449,698 B1 | 9/2016 | Paudel et al. | |
| 9,552,885 B2 | 1/2017 | Shukla et al. | |
| 9,711,229 B1 * | 7/2017 | Rabkin | H10B 43/10 |
| 2006/0053247 A1 * | 3/2006 | Cheung | G11C 16/16 711/103 |
| 2010/0042772 A1 * | 2/2010 | Bonella | G11C 11/5628 711/E12.016 |
| 2010/0074007 A1 * | 3/2010 | Parker | G11C 16/3486 365/185.29 |

(Continued)

*Primary Examiner* — Sean D Rossiter
(74) *Attorney, Agent, or Firm* — PEARL COHEN ZEDEK LATZER BARATZ LLP

(57) ABSTRACT

A non-volatile memory system is configured to permanently erase a single file from a block of non-volatile memory cells. That block is storing programmed data including the single file to be erased and other programmed data. The single file is erased from the block such that the other programmed data in the block is not moved or otherwise disturbed.

20 Claims, 21 Drawing Sheets

(56) References Cited

U.S. PATENT DOCUMENTS

| | | | |
|---|---|---|---|
| 2012/0250413 A1* | 10/2012 | Kim | G11C 16/04 |
| | | | 365/185.11 |
| 2019/0171559 A1* | 6/2019 | Lee | G06F 12/0246 |
| 2020/0152271 A1 | 5/2020 | Sakui et al. | |
| 2024/0338131 A1* | 10/2024 | Li | G11C 16/16 |

* cited by examiner

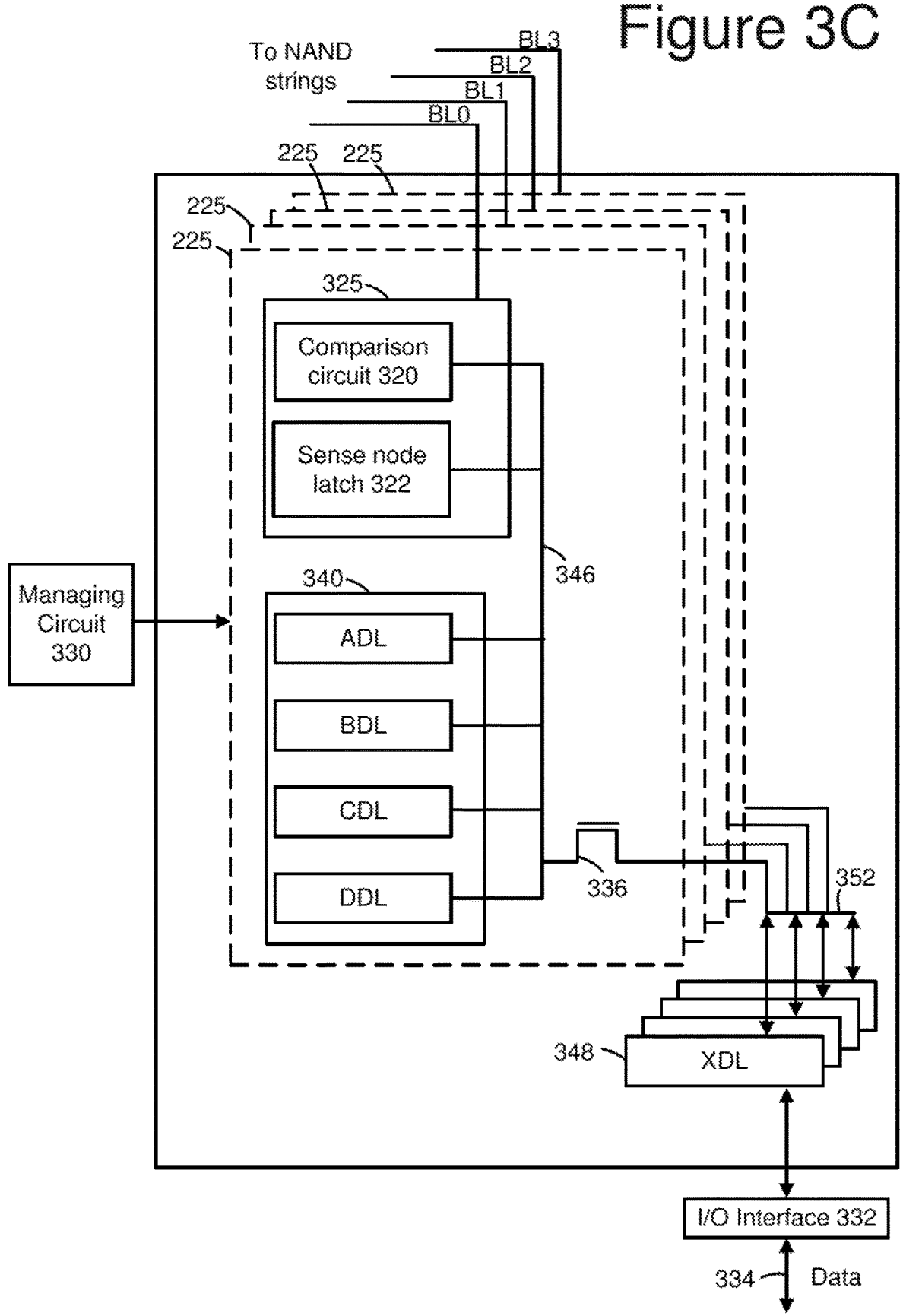

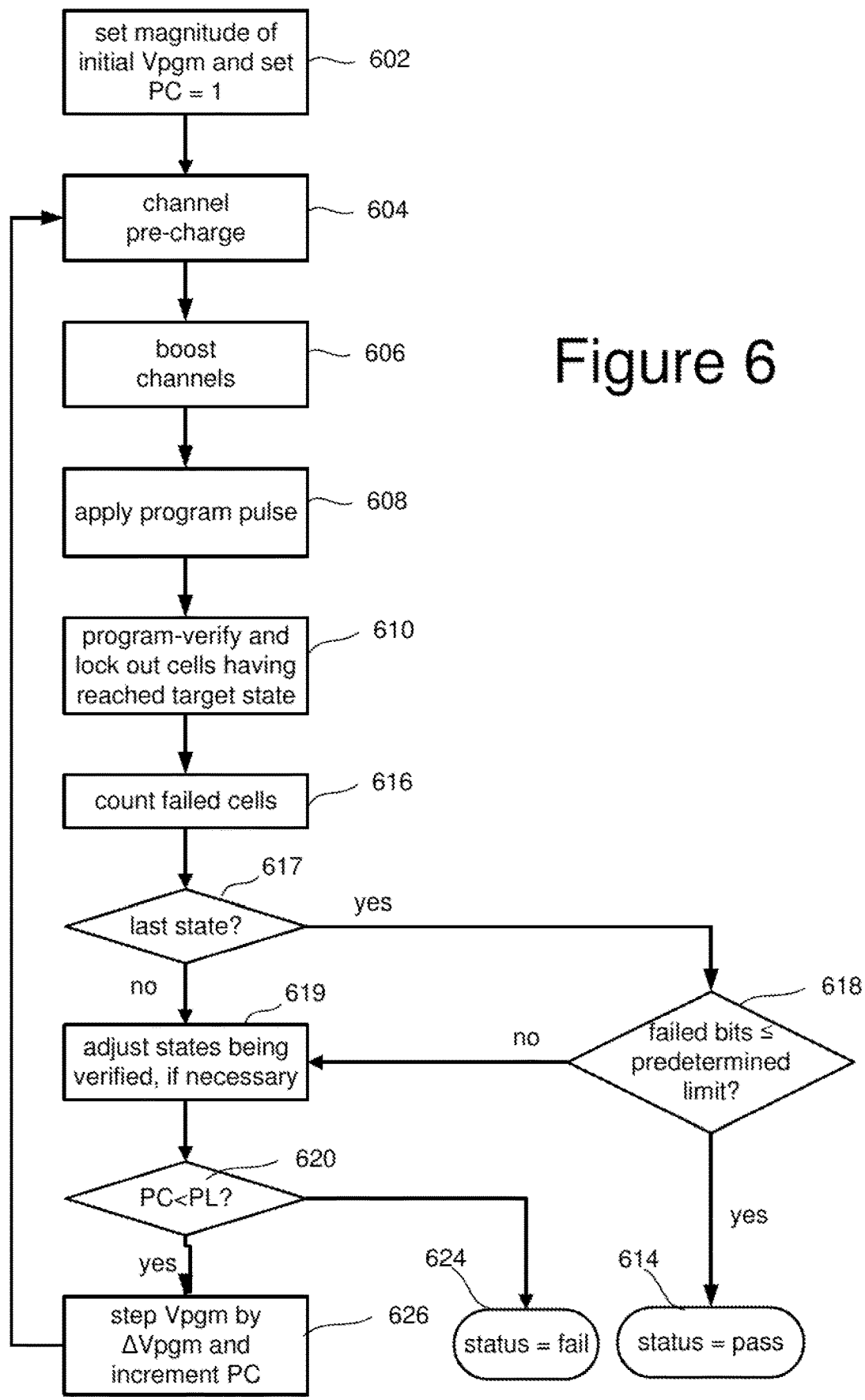

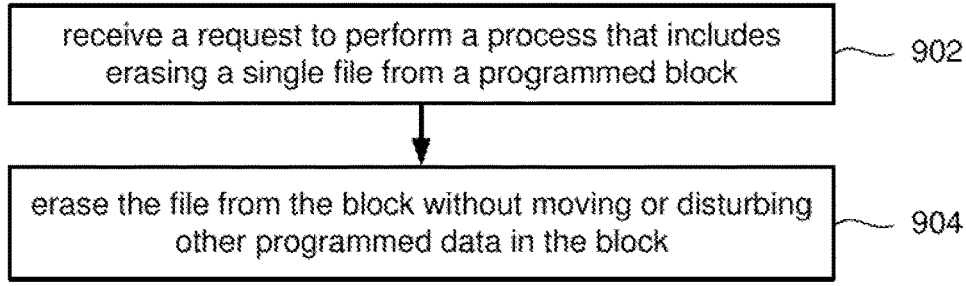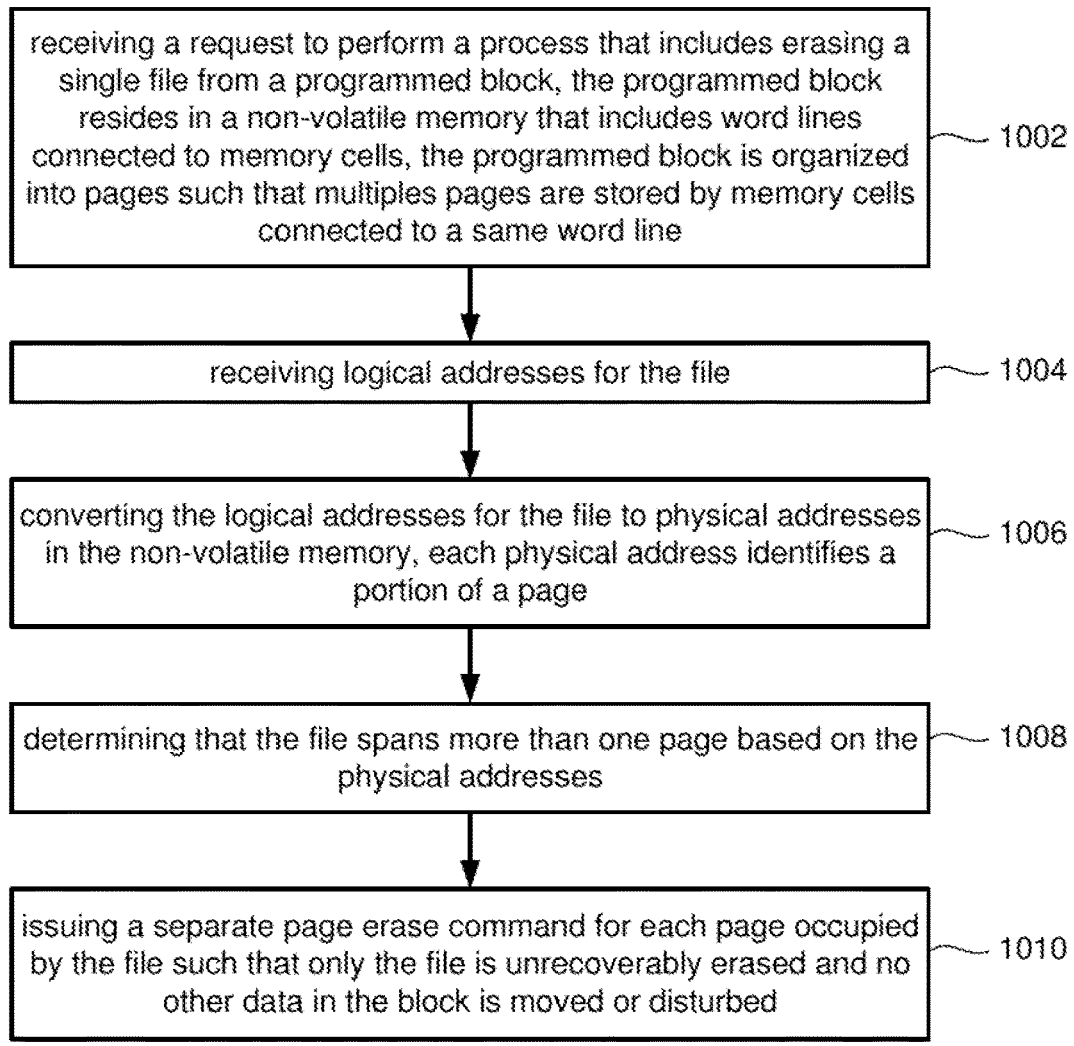

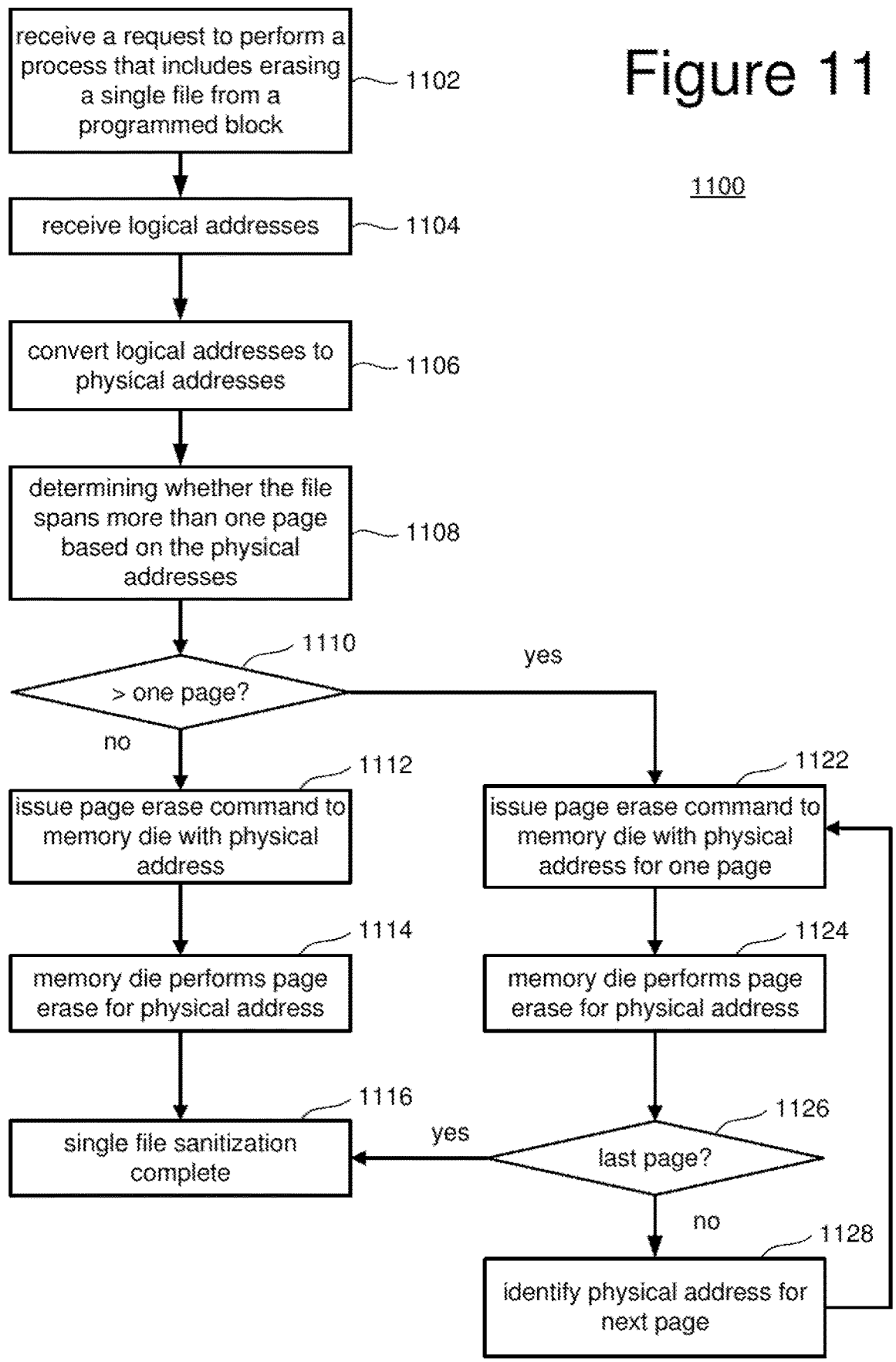

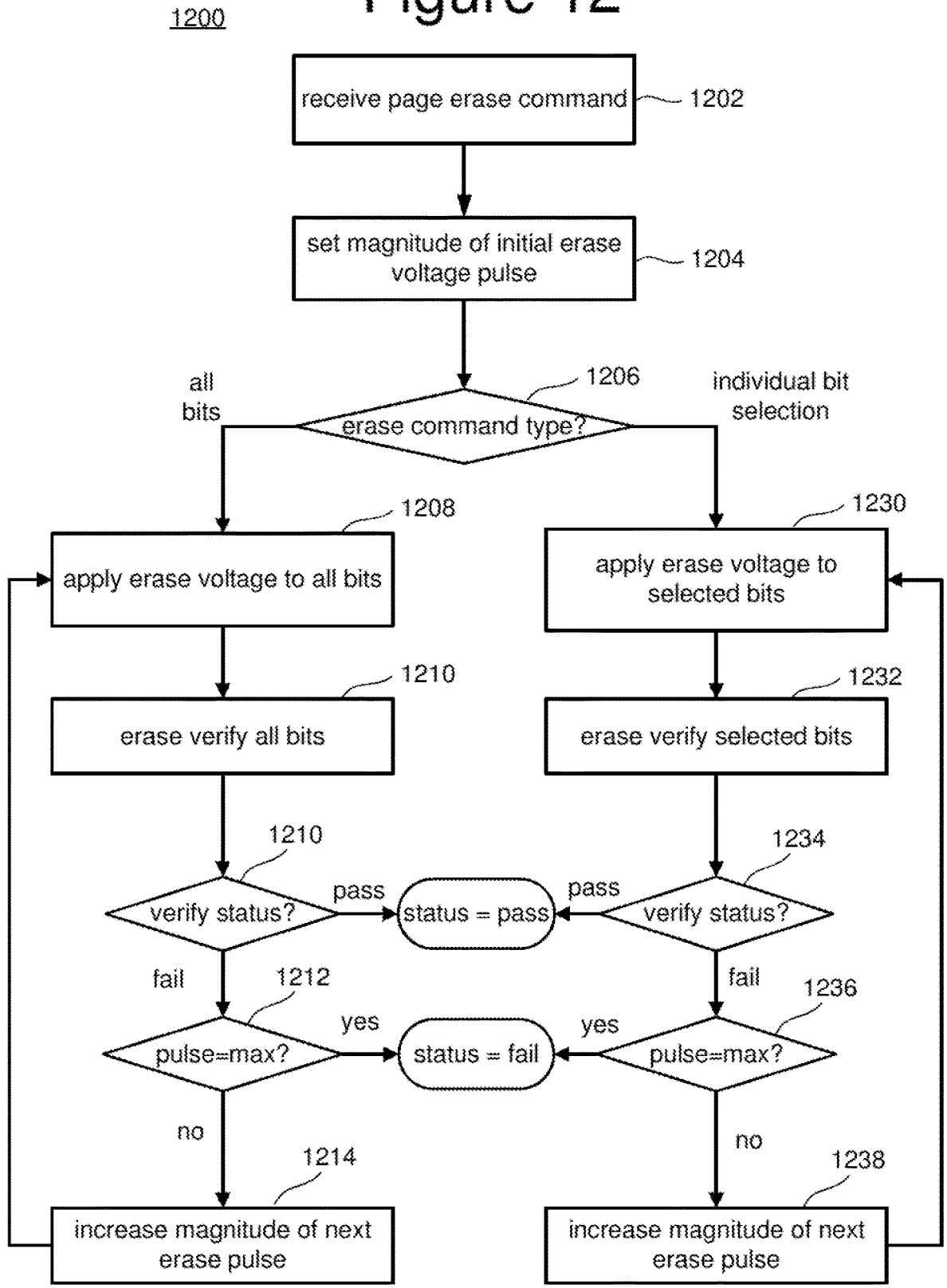

NON-VOLATILE MEMORY WITH SECURE ERASE

CLAIM TO PRIORITY

The present application claims priority from U.S. Provisional Patent Application No. 63/495,257, entitled "NON-VOLATILE MEMORY WITH SECURE ERASE", filed Apr. 10, 2023, incorporated by reference herein in its entirety.

BACKGROUND

The present disclosure relates to non-volatile memory.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. The memory structure may be three-dimensional (3D). One type of 3D structure has non-volatile memory cells arranged as vertical NAND strings. The 3D memory structure may be arranged into units that are commonly referred to as physical blocks. For example, a block in a NAND memory system contains many NAND strings. A NAND string contains memory cell transistors connected in series, a drain side select gate at one end, and a source side select gate at the other end. Each NAND string is associated with a bit line. The block typically has many word lines that provide voltages to the control gates of the memory cell transistors. In some architectures, each word line connects to the control gate of one memory cell on each respective NAND string in the block.

For memory such as NAND, a large set of memory cells are erased prior to programming. In one embodiment, the unit of erase is the block. Blocks are divided into pages (also known as physical pages). In one embodiment, the page is the unit of programming. The non-volatile memory cells may be programmed to store data. Typically, the memory cells are programmed to a number of data states. Using a greater number of data states allows for more bits to be stored per memory cell. For example, four data states may be used to store two bits per memory cell, eight data states may be used in order to store three bits per memory cell, 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell.

BRIEF DESCRIPTION OF THE DRAWINGS

Like-numbered elements refer to common components in the different figures.

FIG. 3C is a block diagram depicting one embodiment of a portion of column control circuitry that contains a number of read/write circuits.

FIG. 6 is a flow chart describing one embodiment of a process for programming non-volatile memory.

FIG. 9 is a flowchart describing one embodiment of a process for securely erasing a file from a block.

FIG. 10 is a flowchart describing one embodiment of a process for securely erasing a file from a block.

FIG. 11 is a flowchart describing one embodiment of a process for securely erasing a file from a block.

FIG. 12 is a flowchart describing one embodiment of a process for securely erasing a file from a block.

DETAILED DESCRIPTION

Ensuring the safety of data in non-volatile memory is a top priority. Users do not want hackers to recover data stored in a non-volatile memory after the user deletes the data, especially in the enterprise environment where sensitive date is stored, such as financial transactions. Therefore, users of non-volatile memory need a reliable method to do individual file sanitization, which comprises securely erasing small amounts of data from non-volatile memory, for example, removing personal information from a smart phone or deleting a sensitive document from a SSD. In regard to this kind of individual file sanitization, there are two goals: (1) permanently delete data without any possible way to recover and (2) not move or disturb other data in the block.

In prior systems, data for an entire block is erased together during a single erase operation. Although this method can permanently remove the data, the other data/files in the same block are simultaneously deleted as well.

Many prior systems also use a flash translation layer (FTL), usually implemented by software in the memory controller. When a data at one logical address is updated, the new data is rewritten elsewhere instead of at original physical location. The data in the original physical location becomes obsolete and marked in the FTL as invalid. If this original data is sensitive data, although it isn't visible by a host or by user, there is risk that this data can be reconstructed and retrieved since the stale data is still physically existing in the original physical location.

To remedy the above-described issues, a non-volatile memory system is configured to permanently erase a single file from a block of non-volatile memory cells. That block is storing programmed data including the single file to be erased and other programmed data. The single file is removed from the block such that the other programmed data in the block is not moved or otherwise disturbed.

Figure 1:
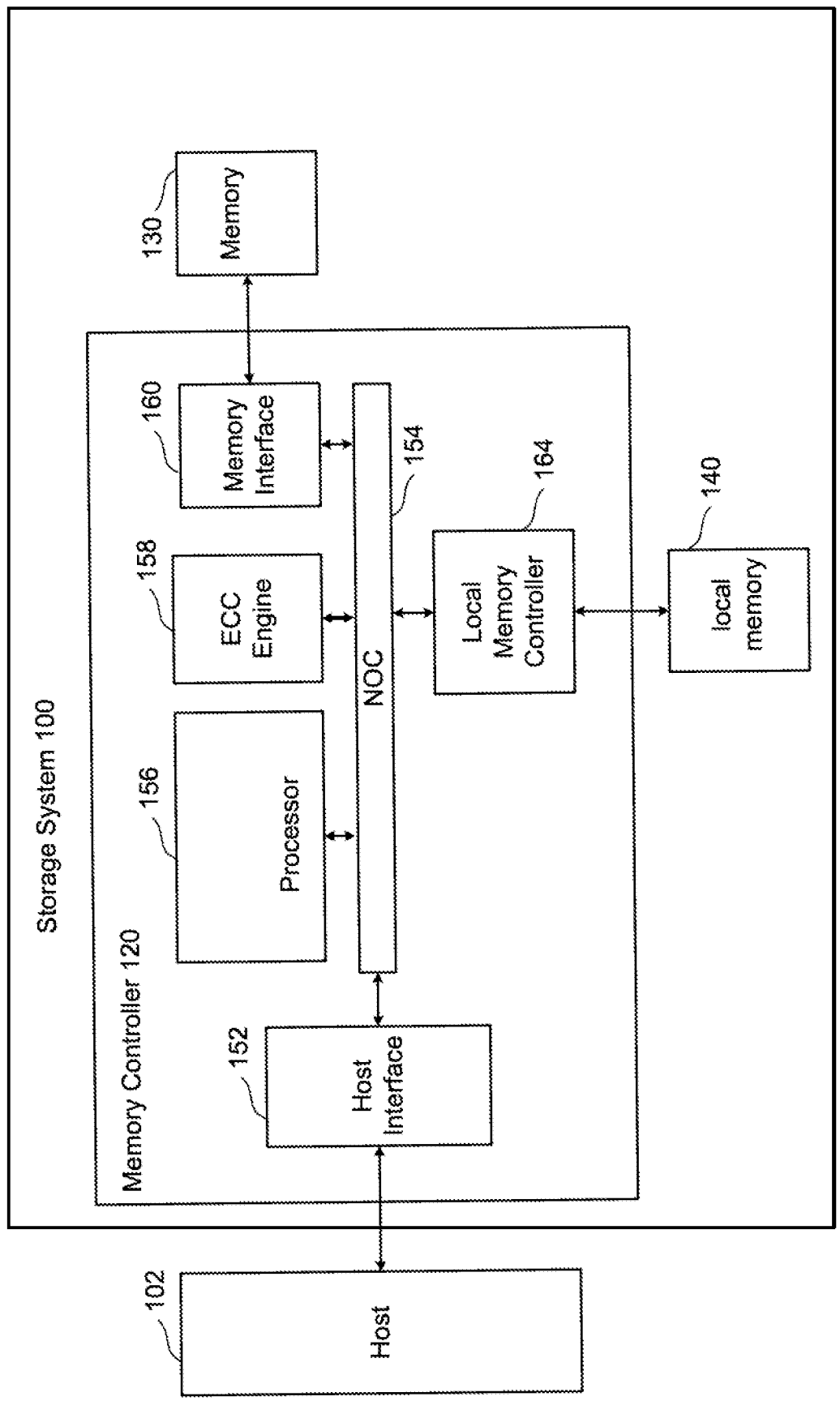
FIG. 1 is a block diagram depicting one embodiment of a storage system.

FIG. 1 is a block diagram of one embodiment of a storage system 100 that implements the technology described herein. In an embodiment, the storage system 100 is configured to implement a post-program erase. In one embodiment, storage system 100 is a solid state drive ("SSD"). Storage system 100 may be referred to as a "non-volatile storage system." Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit.

In many storage systems, the non-volatile memory is addressed internally to the memory system using physical addresses associated with one or more memory die. However, the host will use logical addresses to address the various memory locations. This enables the host to assign data to consecutive logical addresses, while the memory system is free to store the data as it wishes among the locations of the one or more memory die. To enable this system, the memory controller 120 typically performs translation between the logical addresses used by the host and the physical addresses used by the memory die ("address translation"). One example implementation is to maintain data structures that identify the current translation between logical addresses and physical addresses. One example of such a data structure is referred to as a L2P table. For purposes of this document, a L2P table is a data structure that identifies translation between logical addresses and physical addresses. The L2P table does not need to literally be a table, and many different forms of a data structure can function as and be referred to as a L2P table as long as they enable translation of a logical address to a physical address. For purposes of this document, the one or more data structures that enable translation of logical addresses to a physical addresses can be referred to as one L2P table or multiple L2P tables. For example, the data structure can be broken up into blocks or other units.

Typically, the memory controller is connected to a local volatile memory that stores all or a portion of the L2P tables. In some examples, the memory space of a memory system is so large that the local memory cannot hold all of the L2P tables as well as any other information (besides L2P tables) that the local memory is used to store. In such a case, the entire set of L2P tables are stored in the non-volatile memory and a subset of the L2P tables are cached in the local memory (referred to as L2P cache). The bigger the L2P cache, the higher performance of the memory system. However, the bigger cache requires bigger local memories, which increases the costs of a memory system. Additionally, some address spaces are so large that it is not practical (even if cost is not a consideration) to implement a local memory big enough to store all L2P tables.

Typically, when a host requests that a memory system perform a memory operation (e.g., write or read), before the memory system performs the operation the memory system first translates one or more logical addresses from the host to one or more physical addresses in the memory system.

Memory interface 160 communicates with non-volatile storage 130. In one embodiment, memory interface provides a Toggle Mode interface. Other interfaces can also be used. In some example implementations, memory interface 160

(or another portion of controller 120) implements a scheduler and buffer for transmitting data to and receiving data from one or more memory die.

Figure 2A:
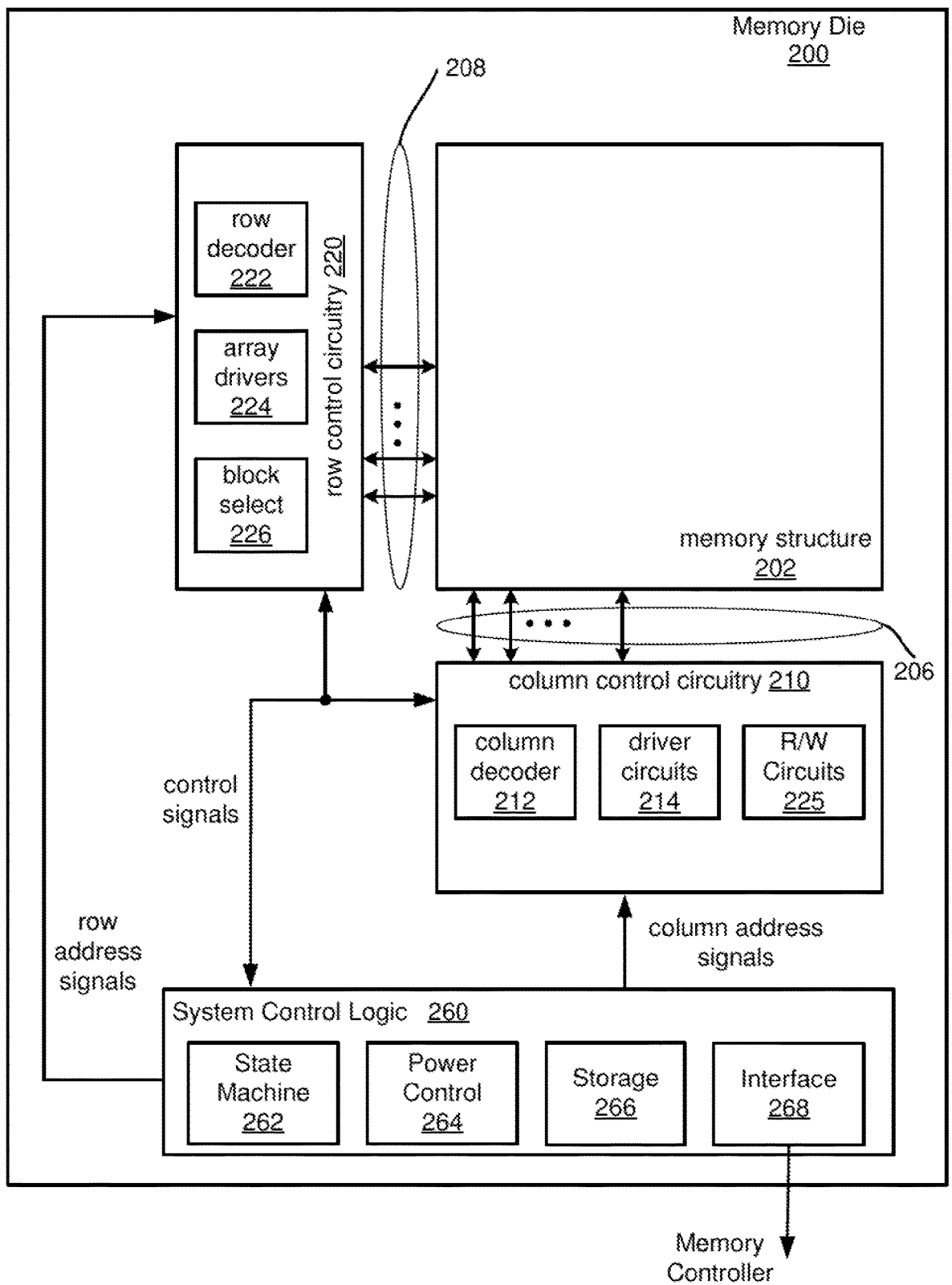
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only a single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, as well as read/write circuitry 225, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used. In one embodiment, the memory die 200 receives a command via memory controller interface 268 to perform a post-program erase.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2B:
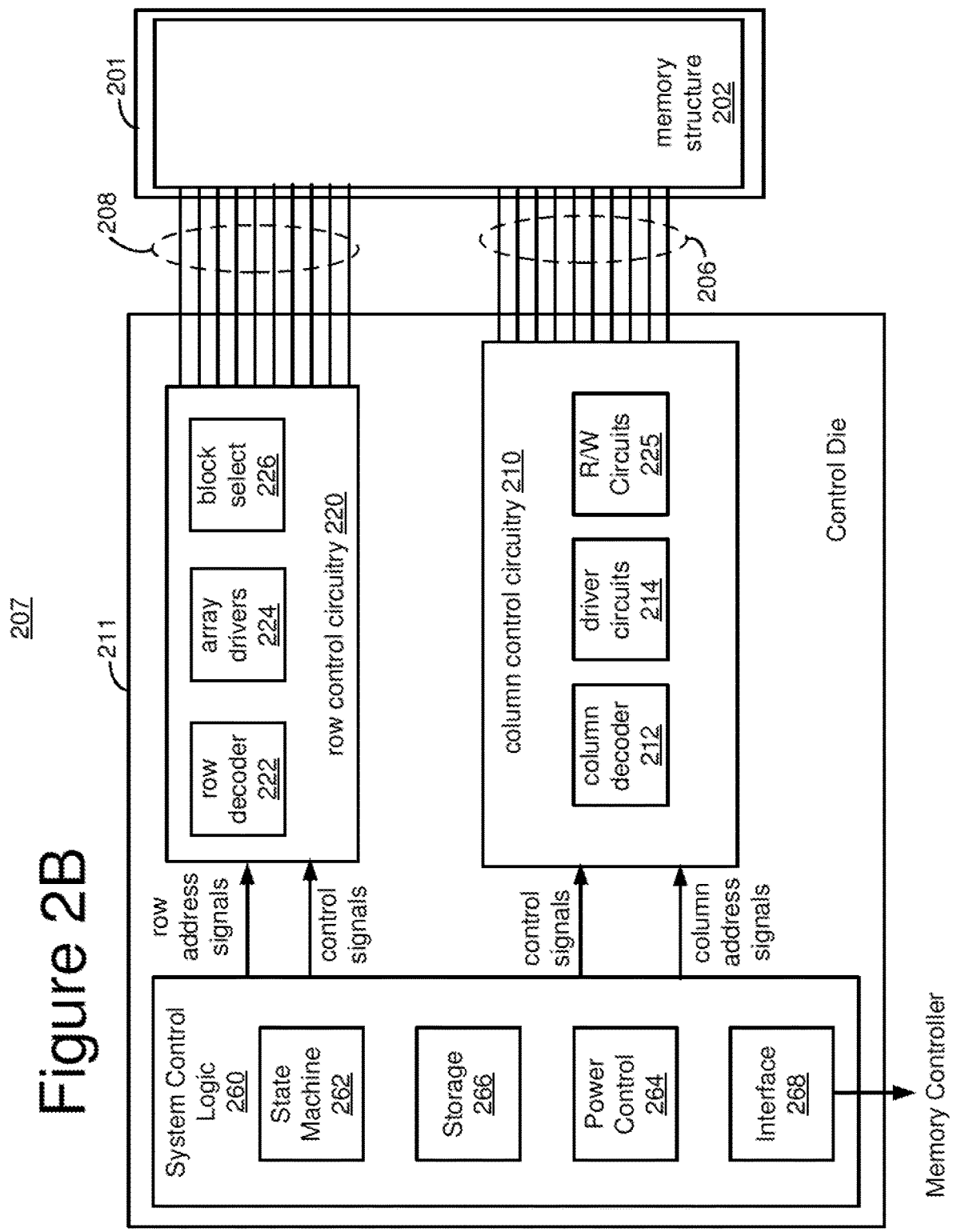
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and R/W circuits 225 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include, but is not limited to, any one of or any combination of state machine 262, power control 264, all or a portion of system control logic 260, all or a portion of row control circuitry 220, all or a portion of column control circuitry 210, read/write circuits 225, sense amps, memory controller 120, a microcontroller, a microprocessor, and/or other similar functioned circuits. A control circuit can include hardware only or a combination of hardware and software (including firmware). For example, one embodiment of a control circuit includes a memory controller 120 programmed by firmware to perform the functions described herein. A control circuit can include memory controller 120 in combination with system control logic 260, row control circuitry 220, and column control circuitry 210. A control circuit can include a processor, FPGA, ASIC, integrated circuit, or other type of circuit.

Figure 3A:
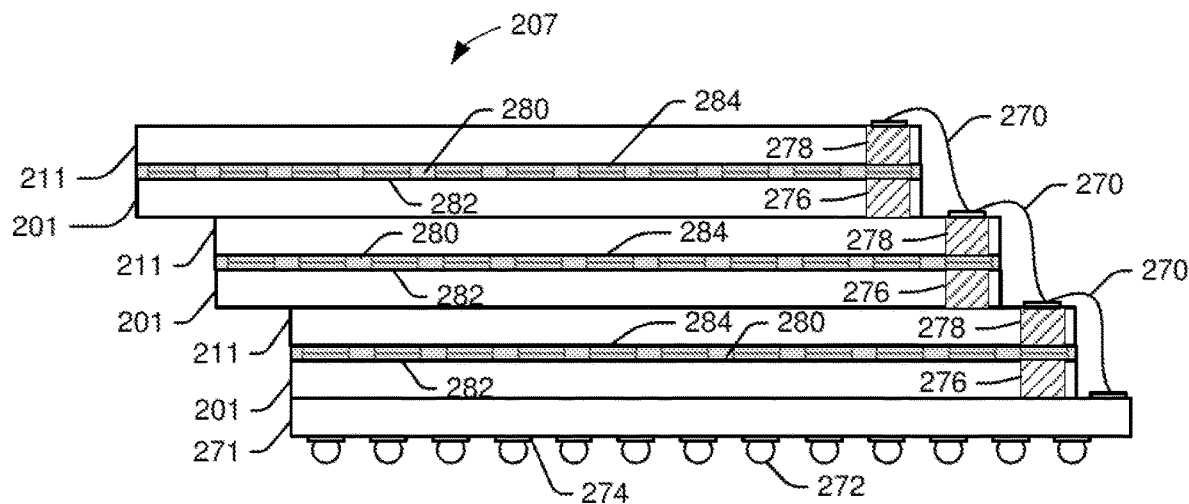
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
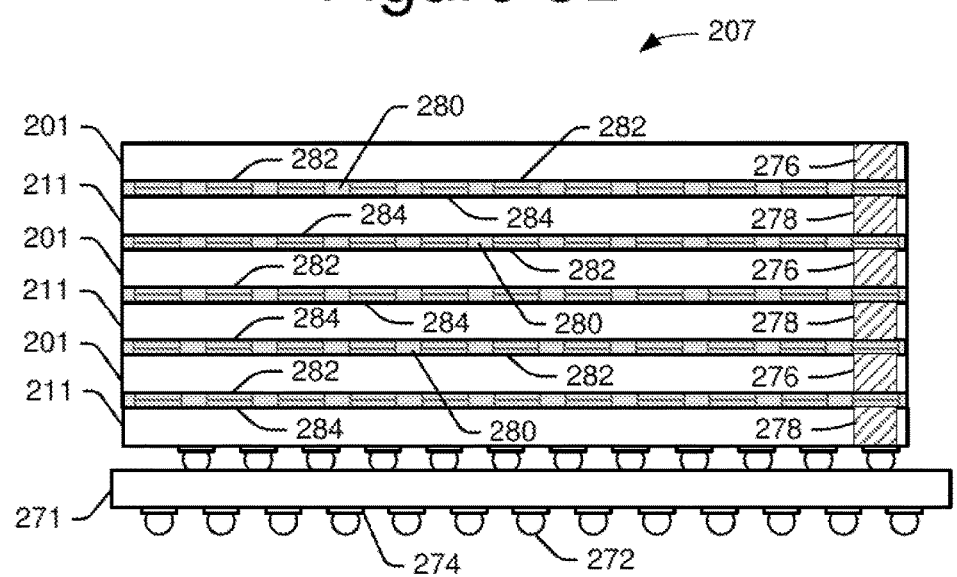

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

FIG. 3C is a block diagram depicting one embodiment of a portion of column control circuitry 210 that contains a number of read/write circuits 225. Each read/write circuit 225 is partitioned into a sense amplifier 325 and data latches 340. A managing circuit 330 controls the read/write circuits 225. The managing circuit 330 may communicate with state machine 262. In one embodiment, each sense amplifier 325 is connected to a respective bit line. Each bit line may be connected, at one point in time, to one of a large number of different NAND strings. A select gate on the NAND string may be used to connect the NAND string channel to the bit line.

Each sense amplifier 325 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier.

Each sense amplifier 325 may have a sense node. During sensing, a sense node is charged up to an initial voltage, Vsense_init, such as 3V. The sense node is then connected to the bit line for a sensing time, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state. In an embodiment, the sense node has a capacitor that is pre-charged and then discharged for the sensing time.

In particular, the comparison circuit 320 determines the amount of decay by comparing the sense node voltage to a trip voltage after the sensing time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 322 is set to 0 or 1, for example, by the comparison circuit 320 based on whether the memory cell is in a conductive or non-conductive state, respectively. The bit in the sense node latch 322 can also be used in a lockout scan to decide whether to set a bit line voltage to an inhibit or a program enable level in a next program loop. The bit in the sense node latch 322 can also be used in a lockout mode to decide whether to set a bit line voltage to a sense voltage or a lockout voltage in a read operation.

The data latches 340 are coupled to the sense amplifier 325 by a local data bus 346. In one embodiment, the data latches 340 include four latches (ADL, BDL, CDL, DDL) for each sense amplifier 325 in this example. More or fewer than four latches may be included in the data latches 340. In one embodiment, for programming each data latch 340 is used to store one bit to be stored into a memory cell and for reading each data latch 340 is used to store one bit read from a memory cell. In a four bit per memory cell embodiment, ADL, BDL, CDL and DDL each store a bit of data to be programmed or read. Each read/write circuit 225 is connected to an XDL latch 348 by way of an XDL bus 352. In this example, transistor 336 connects local data bus 346 to XDL bus 352. An I/O interface 332 is connected to the XDL latches 348. The XDL latch 348 associated with a particular read/write circuit 225 serves as an interface latch for storing/latching data from the memory controller 120.

Managing circuit 330 performs computations, such as to determine the data stored in the sensed memory cell and store the determined data in the set of data latches. Each set of data latches 340 is used to store data bits determined by managing circuit 330 during a read operation, and to store data bits imported from the data bus 334 during a program operation which represent write data meant to be programmed into the memory. I/O interface 332 provides an interface between XDL latches 348 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to managing circuit 330. At that point, managing circuit 330 determines the resultant memory state by consideration of the tripping event(s) of the sense circuit and the information about the applied control gate voltage from the state machine. It then computes a binary encoding for the memory state and stores the resultant data bits into data latches 340.

During program or verify operations for memory cells, the data to be programmed (write data) is stored in the set of data latches 340 from the data bus 334 by way of XDL latches 348. The program operation, under the control of the state machine 262, applies a series of programming voltage pulses to the control gates of the addressed memory cells. Each voltage pulse may be stepped up in magnitude from a previous program pulse by a step size in a process referred to as incremental step pulse programming. In one embodiment, each program voltage is followed by a verify operation to determine if the memory cells have been programmed to the desired memory state. In some cases, managing circuit 330 monitors the read back memory state relative to the desired memory state. When the two agree, managing circuit 330 sets the bit line in a program inhibit mode such as by updating its latches. This inhibits the memory cell coupled to the bit line from further programming even if additional program pulses are applied to its control gate.

Figure 4:
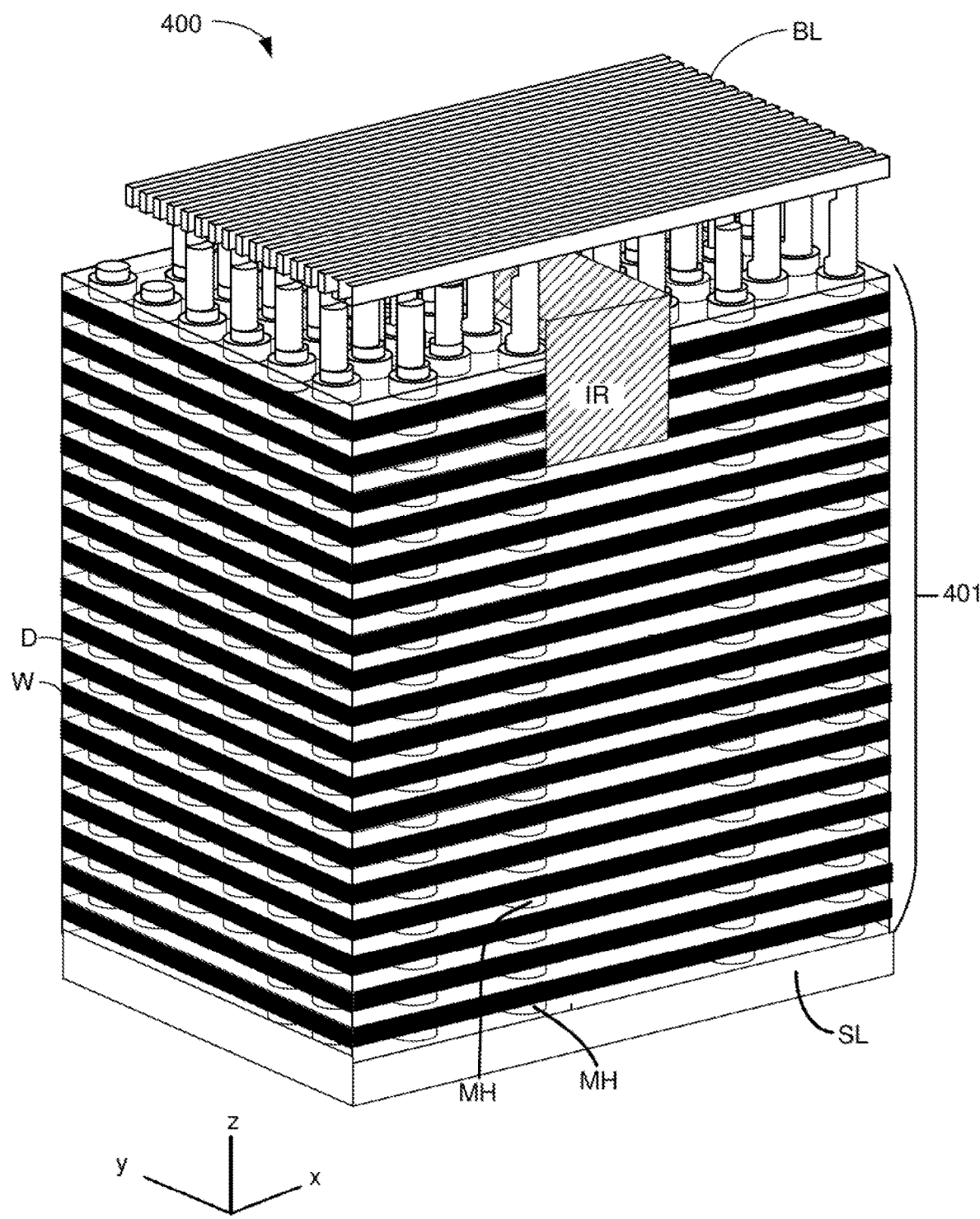
FIG. 4 is a perspective view of a portion of one example of a monolithic three dimensional memory structure.

FIG. 4 is a perspective view of a portion of one example of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
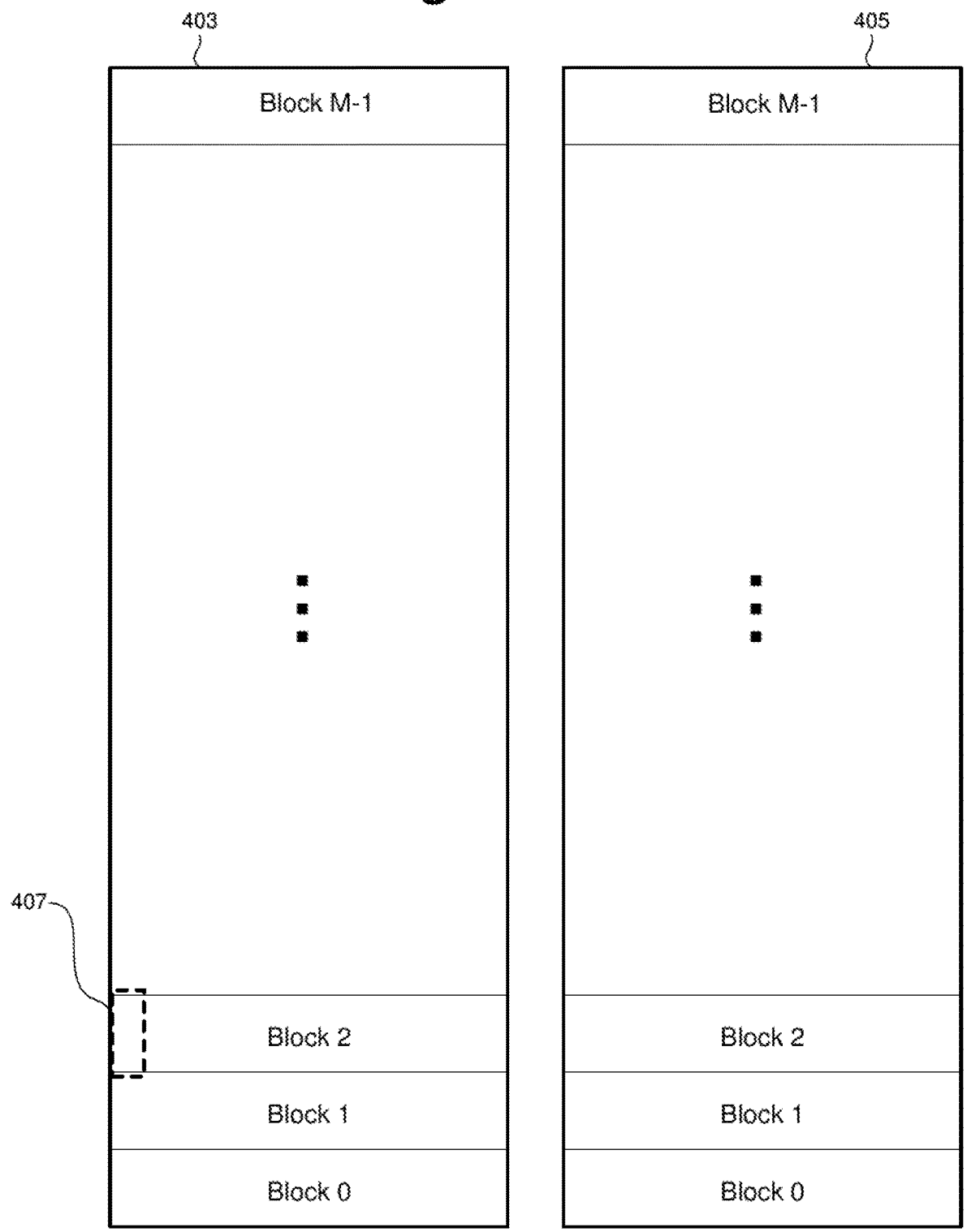
FIG. 4A is a block diagram of one example of a memory structure having two planes.

FIG. 4A is a block diagram explaining one example organization of memory structure 202, which is divided into two planes 403 and 405. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into physical blocks for other reasons, such as to organize the memory structure to enable the signaling and selection circuits. In some embodiments, a block represents a group of connected memory cells as the memory cells of a block share a common set of word lines. For example, the word lines for a block are all connected to all of the vertical NAND strings for that block. Although FIG. 4A shows two planes 403/405, more or fewer than two planes can be implemented. In some embodiments, memory structure 202 includes four planes. In some embodiments, memory structure 202 includes eight planes. In some embodiments, programming can be performed in parallel in a first selected block in plane 403 and a second selected block in plane 405.

Figure 4B:
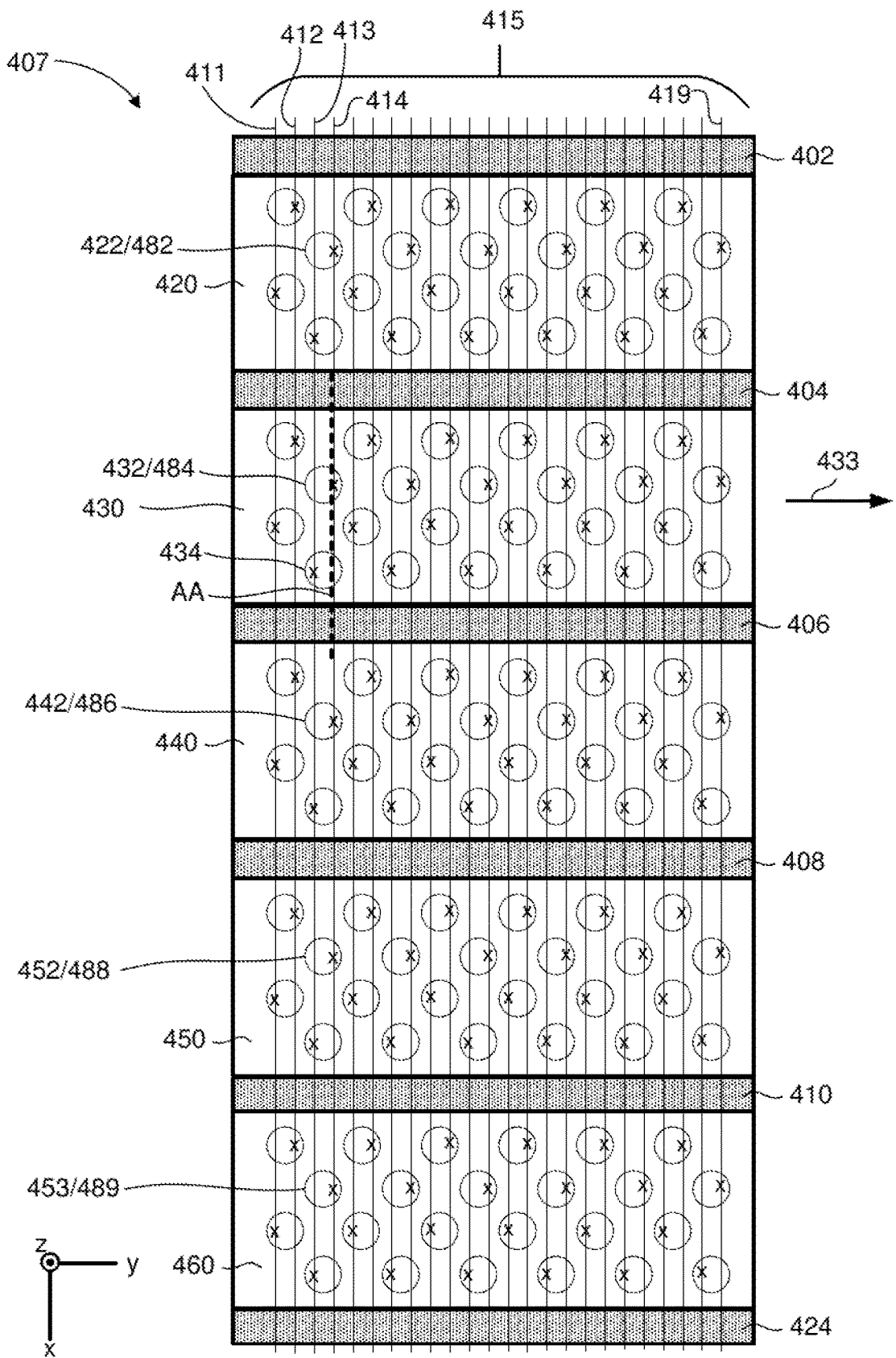
FIG. 4B is a block diagram depicting a top view of a portion of physical block of memory cells.

FIGS. 4B-4E depict an example three dimensional ("3D") NAND structure that corresponds to the structure of FIG. 4 and can be used to implement memory structure 202 of FIGS. 2A and 2B. FIG. 4B is a diagram depicting a top view of a portion 407 of Block 2. As can be seen from FIG. 4B, the physical block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, 452 and 453. Vertical column 422 implements NAND string 482. Vertical column 432 implements NAND string 484. Vertical column 442 implements NAND string 486. Vertical column 452 implements NAND string 488. Vertical column 453 implements NAND string 486. Vertical column 452 implements NAND string 489. More details of the vertical columns are provided below. Since the block depicted in FIG. 4B extends in the direction of arrow 433, the block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the block is depicted. It is contemplated that more than twenty-four bit lines connected to vertical columns of the physical block. Each of the circles representing vertical columns has an "x" to indicate its connection to one bit line. For example, bit line 414 is connected to vertical columns 422, 432, 442 and 452.

The block depicted in FIG. 4B includes a set of isolation regions 402, 404, 406, 408, 410, and 424, which are formed of $SiO_2$; however, other dielectric materials can also be used. Isolation regions 402, 404, 406, 408, 410, and 424 serve to divide the top layers of the physical block into five regions; for example, the top layer depicted in FIG. 4B is divided into regions 420, 430, 440, 450, and 460 of which can be referred to as sub-blocks. In one embodiment, isolation regions 402 and 424 separate the physical block 407 from adjacent physical blocks. Thus, isolation regions 402 and 424 may extend down to the substrate. In one embodiment, the isolation regions 404, 406, and 410 only divide the layers used to implement select gates so that NAND strings in different sub-blocks can be independently selected. Referring back to FIG. 4, the IR region may correspond to any of isolation regions 404, 406, or 408. In one example implementation, a bit line only connects to one vertical column/NAND string in each of regions (sub-blocks) 420, 430, 440, 450, and 460. In that implementation, each block has twenty rows of active columns and each bit line connects to five rows in each block. In one embodiment, all of the five vertical columns/NAND strings connected to a common bit line are connected to the same word line (or set of word lines); therefore, the system uses the drain side selection lines to choose one (or another subset) of the five to be subjected to a memory operation (program, verify, read, and/or erase).

Although FIG. 4B shows each region (420, 430, 440, 450, 460) having four rows of vertical columns, five regions (420, 430, 440, 450, 460) and twenty rows of vertical columns in a block, those exact numbers are an example implementation. Other embodiments may include more or fewer regions (420, 430, 440, 450, 460) per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
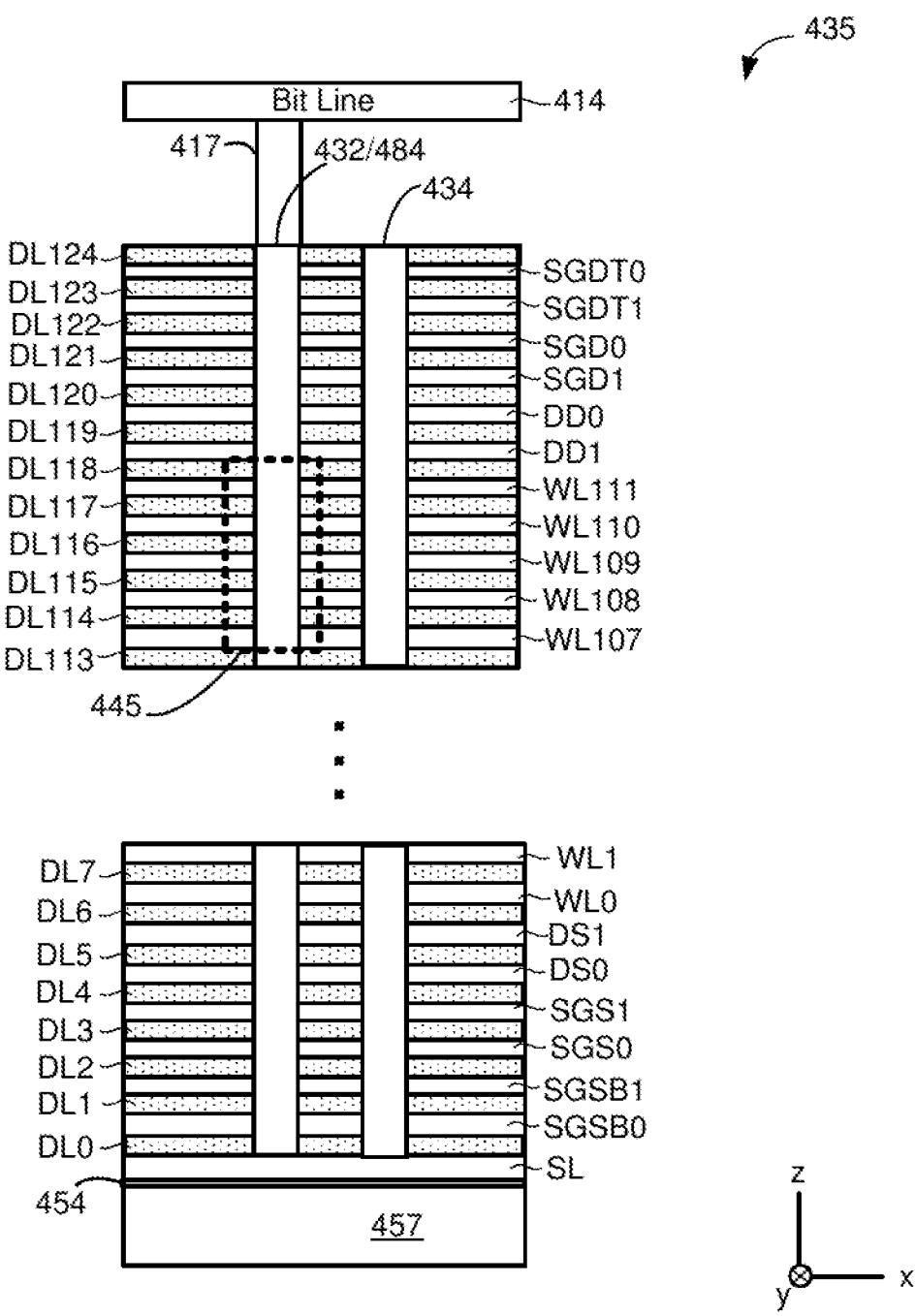
FIG. 4C depicts an example of a stack showing a cross-sectional view along line AA of FIG. 4B.

FIG. 4C depicts an example of a stack 435 showing a cross-sectional view along line AA of FIG. 4B. The SGD layers include SGDT0, SGDT1, SGD0, and SGD1. The SGD layers may have more or fewer than four layers. The SGS layers includes SGSB0, SGSB1. SGS0, and SGS1. The SGS layers may have more or fewer than four layers. Four dummy word line layers DD0, DD1, DS1, and DS0 are provided, in addition to the data word line layers WL0-

WL111. There may be more or fewer than 112 data word line layers and more or fewer than four dummy word line layers. Each NAND string has a drain side select gate at the SGD layers. Each NAND string has a source side select gate at the SGS layers. Also depicted are dielectric layers DL0-DL124.

Columns 432, 434 of memory cells are depicted in the multi-layer stack. The stack includes a substrate 457, an insulating film 454 on the substrate, and a portion of a source line SL. A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 417 connects the drain-end of NAND string 484 to the bit line 414.

In one embodiment, the memory cells are arranged in NAND strings. The word line layers WL0-WL111 connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD are used to electrically connect and disconnect (or cut off) the channels of respective NAND strings from bit lines. Source side select layers SGS are used to electrically connect and disconnect (or cut off) the channels of respective NAND strings from the source line SL.

Figure 4D:
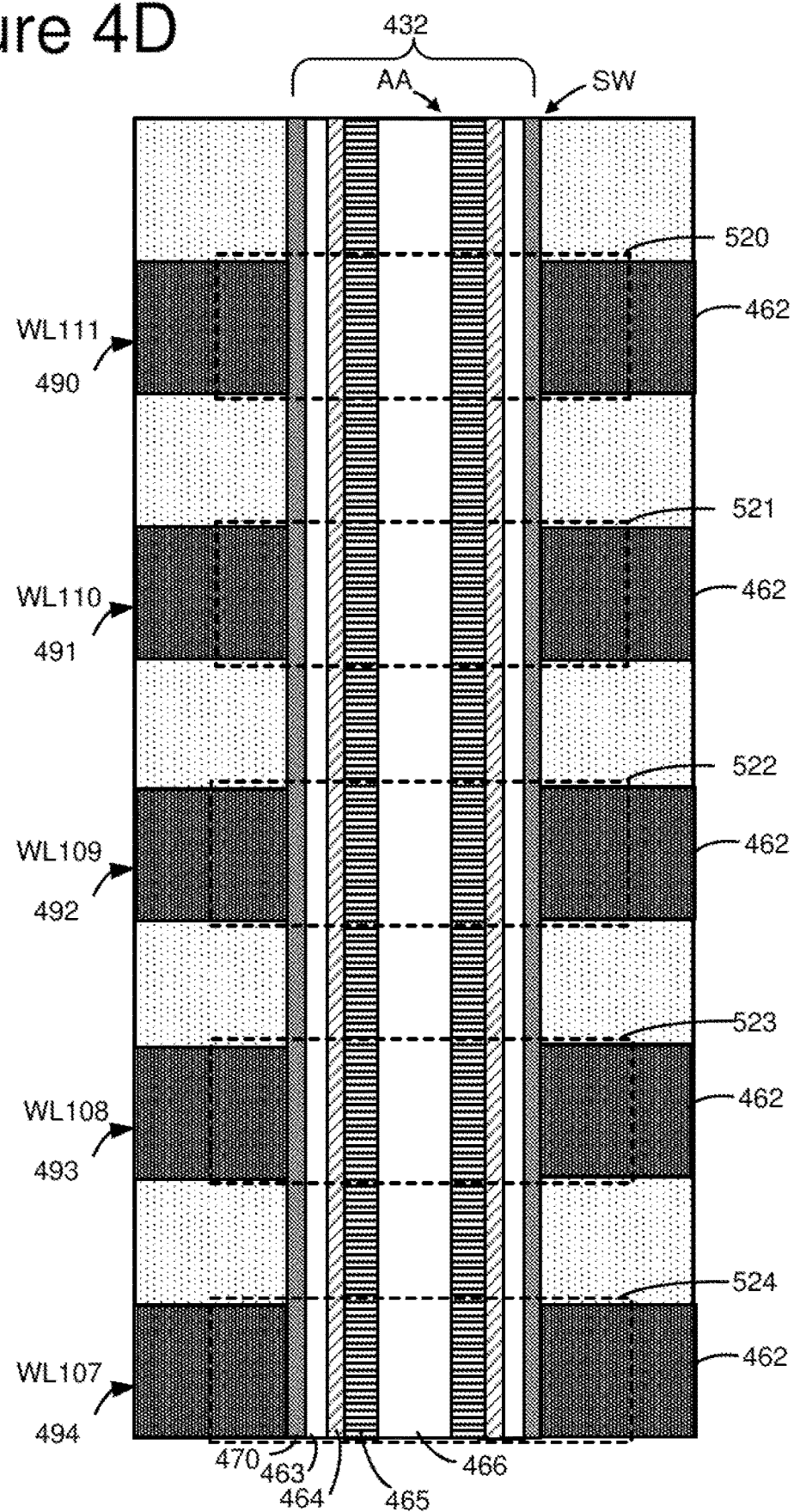
FIG. 4D depicts a view of the region 445 of FIG. 4C.

FIG. 4D depicts a view of the region 445 of FIG. 4C. Data memory cell transistors 520, 521, 522, 523, and 524 are indicated by the dashed lines. A number of layers can be deposited along the sidewall (SW) of the memory hole 432 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
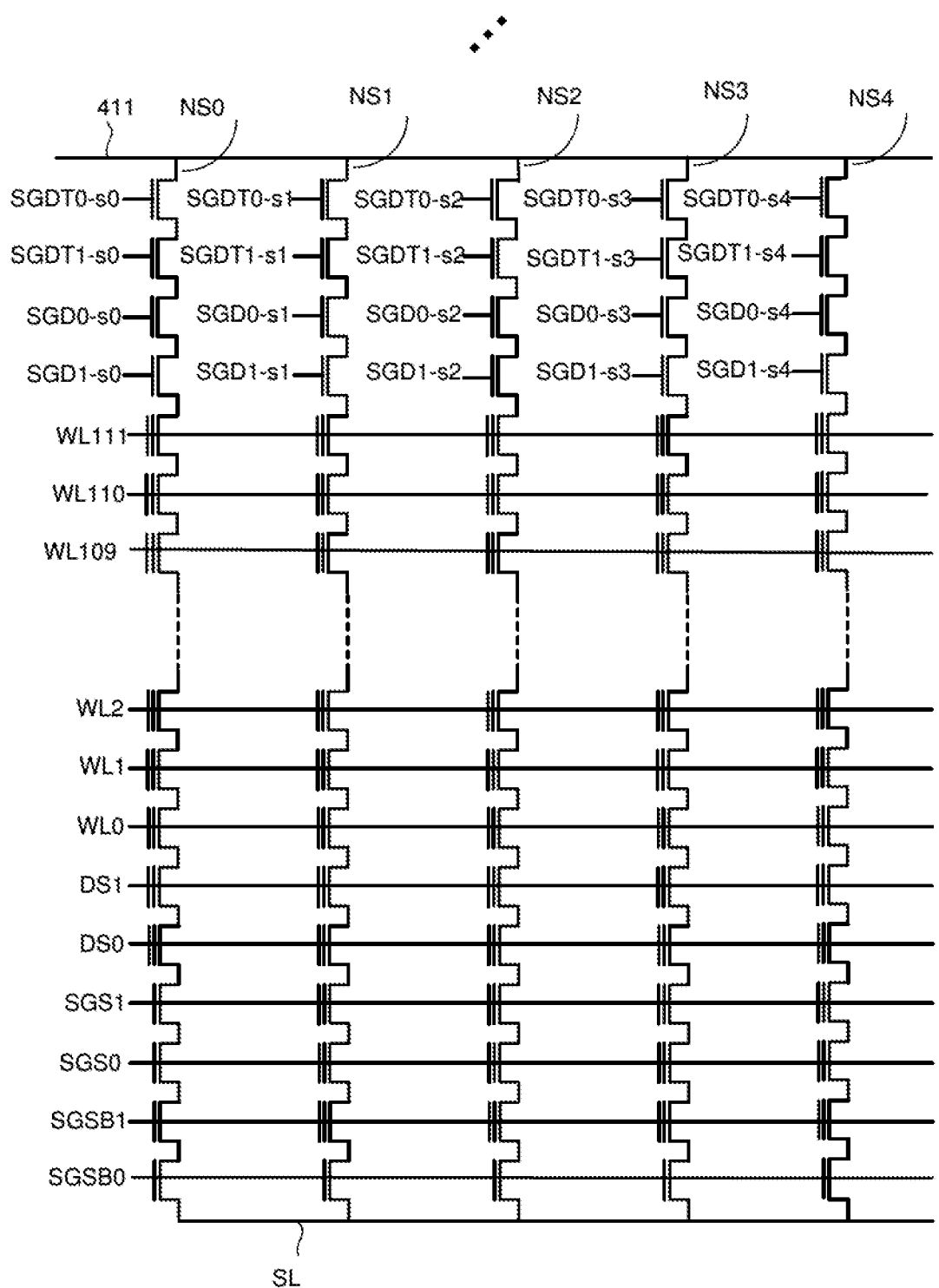
FIG. 4E is a schematic diagram of a portion of one example of a physical block, depicting several NAND strings.

FIG. 4E is a schematic diagram of a portion of the memory array 202. FIG. 4E shows physical data word lines WL0-WL111 running across the entire block. The structure of FIG. 4E corresponds to a portion 407 in Block 2 of FIG. 4A, including bit line 411. Within the physical block, in one embodiment, each bit line is connected to five NAND strings. Thus, FIG. 4E shows bit line 411 connected to NAND string NS0, NAND string NS1, NAND string NS2, NAND string NS3, and NAND string NS4.

In one embodiment, there are five sets of drain side select lines in the physical block. For example, the set of drain side select lines connected to NS0 include SGDT0-s0, SGDT1-s0, SGD0-s0, and SGD1-s0. The set of drain side select lines connected to NS1 include SGDT0-s1, SGDT1-s1, SGD0-s1, and SGD1-s1. The set of drain side select lines connected to NS2 include SGDT0-s2, SGDT1-s2, SGD0-s2, and SGD1-s2. The set of drain side select lines connected to NS3 include SGDT0-s3, SGDT1-s3, SGD0-s3, and SGD1-s3. The set of drain side select lines connected to NS4 include SGDT0-s4, SGDT1-s4, SGD0-s4, and SGD1-s4. Herein the term "SGD" may be used as a general term to refer to any one or more of the lines in a set of drain side select lines. In an embodiment, each line in a given set may be operated independent from the other lines in that set to allow for different voltages to the gates of the four drain side select transistors on the NAND string. Moreover, each set of drain side select lines can be selected independent of the other sets. Each set drain side select lines connects to a group of NAND strings in the block. Only one NAND string of each group is depicted in FIG. 4E. These five sets of drain side select lines correspond to five sub-blocks. A first sub-block corresponds to those vertical NAND strings controlled by SGDT0-s0, SGDT1-s0, SGD0-s0, and SGD1-s0. A second sub-block corresponds to those vertical NAND strings controlled by SGDT0-s1, SGDT1-s1, SGD0-s1, and SGD1-s1. A third sub-block corresponds to those vertical NAND strings controlled by SGDT0-s2, SGDT1-s2, SGD0-s2, and SGD1-s2. A fourth sub-block corresponds to those vertical NAND strings controlled by SGDT0-s3. SGDT1-s3, SGD0-s3, and SGD1-s3. A fifth sub-block corresponds to those vertical NAND strings controlled by SGDT0-s4, SGDT1-s4, SGD0-s4, and SGD1-s4. As noted, FIG. 4E only shows the NAND strings connected to bit line 411. However, a full schematic of the block would show every bit line and five vertical NAND strings connected to each bit line.

In one embodiment, all of the memory cells on the NAND strings in a physical block are erased as a unit. However in some embodiments, a physical block is operated as an upper tier and a lower tier, wherein the upper tier and the lower tier each form an erase block. For example, memory cells connected to WL0-WL61 may be in the lower tier and memory cells connected to WL62-WL111 may be in the upper tier. Hence, memory cells connected to WL0-WL61 may be in one erase block and memory cells connected to WL62-WL111 may be in another erase block. A physical block could be operated in more than two tiers. Erase blocks can be formed based on other divisions of physical blocks.

Figure 4F:
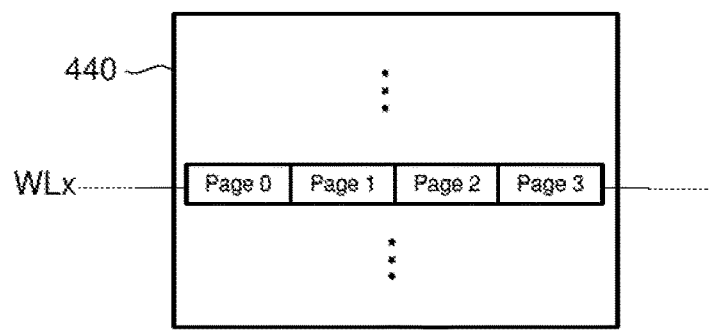
FIG. 4F is a block diagram showing one word line connected to four pages of memory cells.

Each word line is connected to many memory cells. In one embodiment, the memory system includes a sense amplifier for each memory cell connected to a word line so that if a word line connects to X memory cells there are X sense amplifiers and X memory cells can be programmed and/or read concurrently. In other embodiments, the number of sense amplifiers is less than the total number of memory cells connected to a word line; therefore, less than the total number of memory cells connected to a word line can be programmed and/or read concurrently. For example if there are Y sense amplifiers, then Y memory cells connected to a word line can be programmed and/or read concurrently. In one embodiment, the number of memory cells connected to a word line that can be programmed and/or read concurrently is referred to as a page. In one example embodiment, a page is 16K bytes; however, other sizes can also be implemented. In one embodiment, a page is divided into segments; for example, there may be four segments in a page and each segment has its own physical address. In this example, a page is 16K bytes, a segment is 4K bytes, and there are four segments in a page. A programming operation can program all of the memory cells of a page. A read operation can read all of the memory cells of a page or all of the memory cells of a segment. In one embodiment, each of the regions (see regions 420, 430, 440, 450, and 460 of FIG. 4B) includes one page per word line. In other embodiments, each of the regions (see regions 420, 430, 440, 450, and 460 of FIG. 4B) includes multiple pages per word line; for example, the memory cells connected to a common word line in one of the regions (see regions 420, 430, 440, 450, and 460 of FIG. 4B) are grouped into multiple pages. This concept is depicted in FIG. 4F which shows word line WLx running through region 440. The memory cells connected to word line WLx in region 440 are divided into four pages: Page 0, Page 1, Page 2 and Page 3. In other embodiments, more or less than four pages can be implemented.

Although the example memories of FIGS. 4-4F are three dimensional memory structure that includes vertical NAND strings with charge-trapping material, other 3D memory structures can also be used with the technology described herein.

Figure 5A:
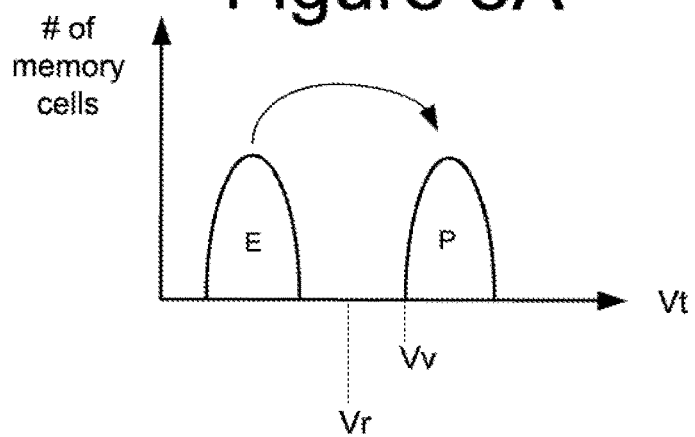
FIG. 5A depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

Figure 5B:
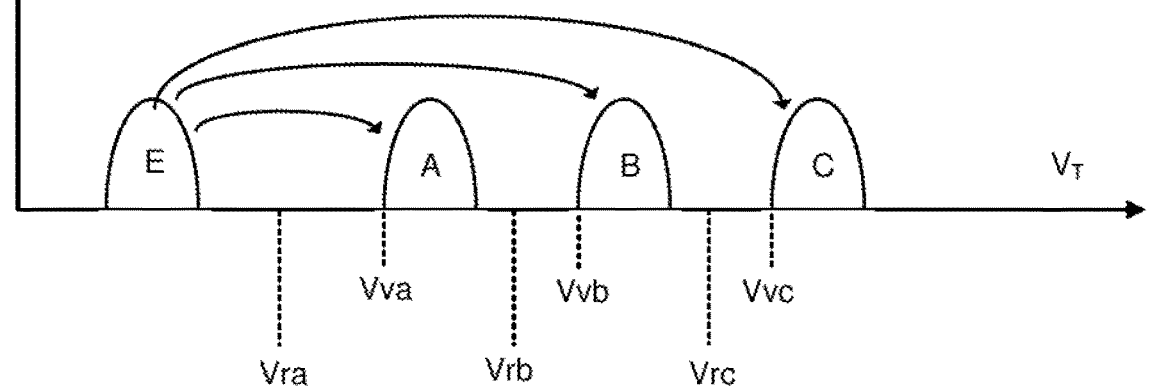
FIG. 5B depicts threshold voltage distributions.
Figure 5C:
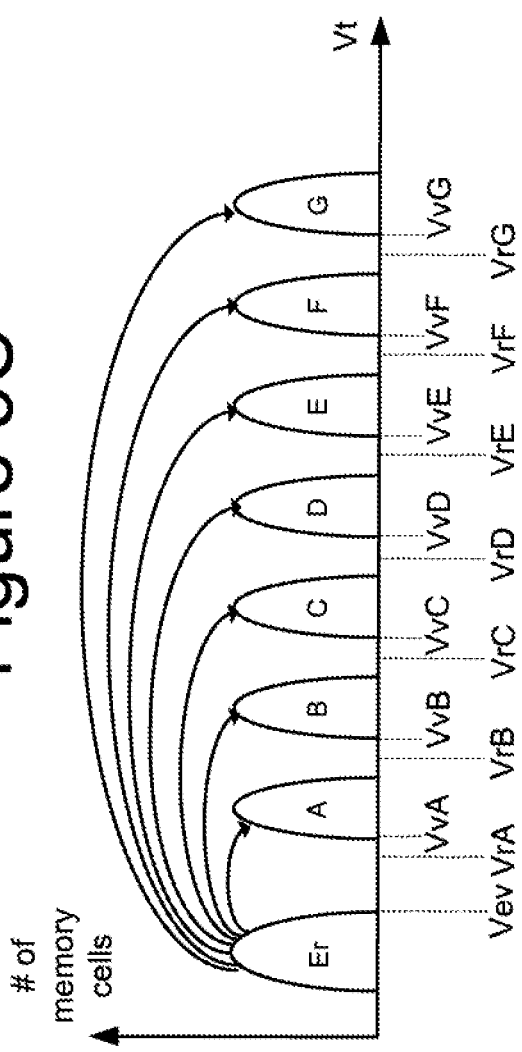
FIG. 5C depicts threshold voltage distributions.
Figure 5D:
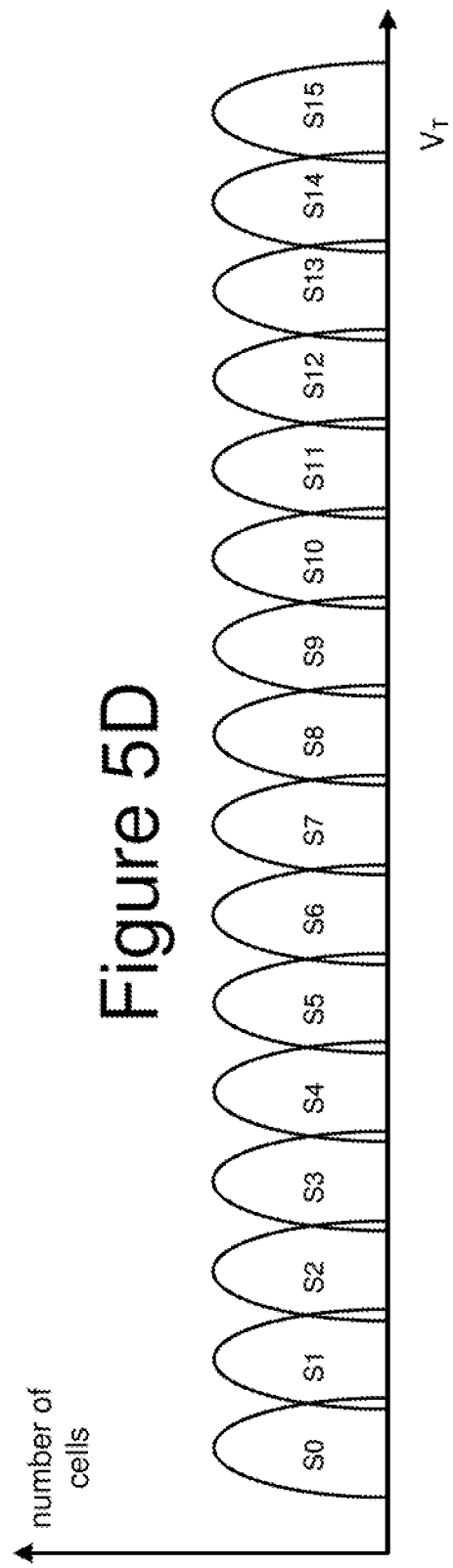
FIG. 5D depicts threshold voltage distributions.

FIGS. 5B-D illustrate example threshold voltage distributions for the memory array when each memory cell stores multiple bit per memory cell data. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, or five bits of data per memory cell).

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits.

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states or programmed data states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5C shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in.

FIG. 5C also shows seven verify reference voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is an erase verify reference voltage to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state Er to data state A, other memory cells are being programmed from data state Er to data state B and/or from data state Er to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare voltages/levels VrA, VrB, VrC, VrD, VrE, VrF, and VrG, of FIG. 5C) or verify operation (e.g. see verify target voltages/levels VvA, VvB, VvC, VvD, VvE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read reference voltages can help to mitigate such effects. Using ECC during the read process can fix errors and ambiguities. Note that in some embodiments, the threshold voltage distributions for a population of memory cells storing four bits of data per memory cell do not overlap and are separated from each other. The threshold voltage distributions of FIG. 5D will include read reference voltages and verify reference voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits. The specific relationship between the data programmed into the memory cell and the threshold voltage levels of the cell depends upon the data encoding scheme adopted for the cells.

FIG. 6 is a flowchart describing one embodiment of a process for programming memory cells. For purposes of this document, the term program and programming are synonymous with write and writing. In one example embodiment, the process of FIG. 6 is performed for memory structure 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory die 201. The process includes multiple loops, each of which includes a program phase and a verify phase. The process of FIG. 6 is performed to implement the full sequence programming, as well as other programming schemes including multi-stage programming. When implementing multi-stage programming, the process of FIG. 6 is used to implement any/each stage of the multi-stage programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. As part of step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming. Note that during steps 604, 606 and 608, voltages are applied to the dummy word lines (including the dummy word lines DU and DL that are next to the Joint area).

In step 610, program-verify is performed, which includes testing whether memory cells being programmed have successfully reached their target data state. Memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state.

In one embodiment of step 610, a smart verify technique is used such that the system only verifies a subset of data states during a program loop (steps 604-628). For example, the first program loop includes verifying for data state A (see FIG. 5C), depending on the result of the verify operation the second program loop may perform verify for data states A and B, depending on the result of the verify operation the third program loop may perform verify for data states B and C, and so on.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 617, the system determines whether the verify operation in the latest performance of step 610 included verifying for the last data state (e.g., data state G of FIG. 5C). If so, then in step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, then the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If in step 617 it was determined that the verify operation in the latest performance of step 610 did not include verifying for the last data state or in step 618 it was determined that the number of failed memory cells is not less than the predetermined limit, then in step 619 the data states that will be verified in the next performance of step 610 (in the next program loop) is adjusted as per the smart verify scheme discussed above. In step 620, the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process continues at step 604 and another program pulse is applied to the selected word line (by the control die) so that another program loop (steps 604-626) of the programming process of FIG. 6 is performed.

In one embodiment memory cells are erased prior to programming. Erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the memory cells. Herein, this is referred to as p-well erase.

Another approach to erasing memory cells is to generate gate induced drain leakage ("GIDL") current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a GIDL generation transistor (e.g., transistors connected to SGDT0, SGDT1, SGSB0, SGSB1). In some embodiments, a select gate (e.g., SGD or SGS) can be used as a GIDL generation transistor. A transistor drain-to-gate voltage that generates a GIDL current is referred to herein as a GIDL voltage. The GIDL current may result when the GIDL generation transistor drain voltage is significantly higher than the GIDL generation transistor control gate voltage. GIDL current is a result of carrier generation, i.e., electron-hole pair generation due to band-to-band tunneling and/or trap-assisted generation. In one embodiment, GIDL current may result in one type of carriers (also referred to a charge carriers), e.g., holes, predominantly moving into the NAND channel, thereby raising or changing the potential of the channel. The other type of carriers, e.g., electrons, are extracted from the channel, in the direction of a bit line or in the direction of a source line, by an electric field. During erase, the holes may tunnel from the channel to a charge storage region of the memory cells (e.g., to charge trapping layer 493) and recombine with electrons there, to lower the threshold voltage of the memory cells.

The GIDL current may be generated at either end (or both ends) of the NAND string. A first GIDL voltage may be created between two terminals of a GIDL generation transistor (e.g., connected to SGDT0 and SGDT1) that is connected to or near a bit line to generate a first GIDL current. A second GIDL voltage may be created between two terminals of a GIDL generation transistor (e.g., SGSB0 and SGSB1) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase. The technology described herein can be used with one-sided GIDL erase and two-sided GIDL erase.

Figure 7:
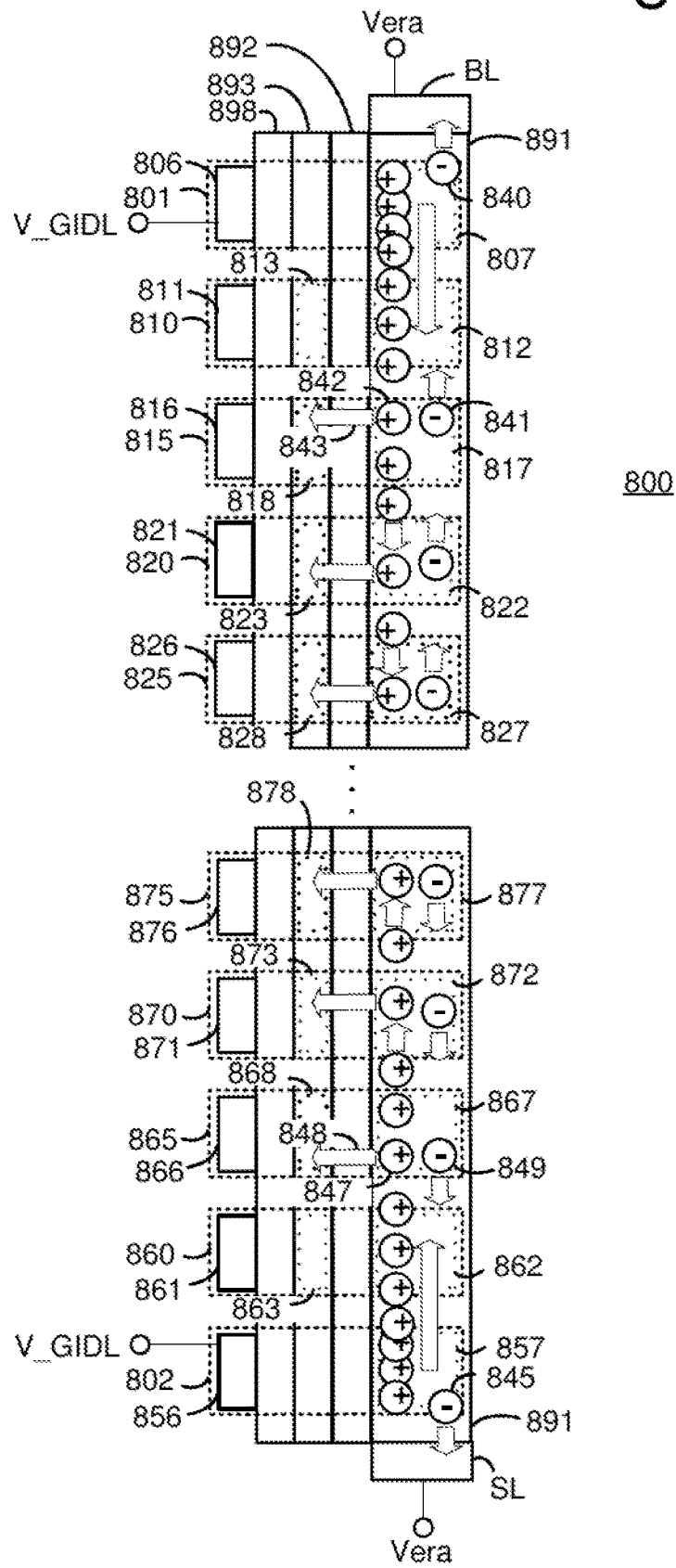
FIG. 7 depicts the erasing of a NAND string.

FIG. 7 depicts the movement of holes and electrons in a NAND string 800 during a two-sided GIDL erase. An example NAND string 800 is depicted that includes a channel 891 connected to a bit line (BL) and to a source line (SL). A tunnel dielectric layer (TNL) 892, charge trapping layer (CTL) 893, and a blocking oxide layer (BOX) 898 are layers which extend around the memory hole of the NAND string (see discussion above). Different regions of the channel layers represent channel regions which are associated with respective memory cells or select gate transistors.

Solely for purposes of simplifying the drawing and the discussion, only one drain side GIDL generation transistor 801 (e.g., representing one of SGDT0 or SGDT1) is depicted in FIG. 7 and only one source side GIDL generation transistor 802 (e.g., representing one of SGSB0 or SGSB1) is depicted in FIG. 7. Also, solely for purposes of simplifying the discussion, the select gates (i.e. SGS and SGD) of NAND string 800 are not depicted in FIG. 7. However, FIG. 7 does show NAND string 800 including memory cells 810, 815, 820, and 825; control gates 811, 816, 821, and 826; CTL regions 813, 818, 823, and 828; and channel regions 812, 817, 822, and 827, respectively. NAND string 800 also includes memory cells 860, 865, 870, and 875; control gates 861, 866, 871, and 876; CTL regions 863, 868, 873, and 878; and channel regions 862, 867, 872, and 877, respectively.

During an erase operation, an erase voltage Vera (e.g., ~20V) is applied to both the bit line (BL) and to the source line (SL). A voltage V_GIDL (e.g., Vera-5V) is applied to the gate 806 of the GIDL generation transistor 801 and to the gate 856 of GIDL generation transistor 802 to enable GIDL. Representative holes are depicted in the channel layers as circles with a "+" sign and representative electrons are depicted in the channel layers as circles with a "−" sign. Electron-hole pairs are generated by a GIDL process. Initially, during an erase operation, the electron-hole pairs are generated at the GIDL generation transistors. The holes move away from the driven ends into the channel, thereby charging the channel to a positive potential. The electrons generated at the GIDL generation transistor 801 move toward the bit line (BL) due to the positive potential there. The electrons generated at the GIDL generation transistor 802 move toward the source line (SL) due to the positive potential there. Subsequently, during the erase period of each memory cell, additional holes are generated by GIDL at virtual junctions which are formed in the channel at the edges of the control gate of the memory cells. Some holes are removed from the channel as they tunnel to the CTL regions.

Electrons are also generated by the GIDL process. Initially, during the erase operation, the electrons are generated at the GIDL generation transistors and move toward the driven ends. Subsequently, during the erase period of each storage element, additional electrons are generated by GIDL at virtual junctions, which are formed in the channel at the edges of the control gate of the memory cells.

At one end (e.g., drain side) of the NAND string, example electrons 840 and 841 move toward the bit line. Electron 840 is generated at the GIDL generation transistor 801 and electron 841 is generated at a junction of the memory cell 815 in the channel region 817. Also, in the drain side, example holes including a hole 842 moving away from the bit line as indicated by arrows. The hole 842 is generated at a junction of memory cell 815 in the channel region 817 and can tunnel into the CTL region 818 as indicated by arrow 843.

At the other end (e.g., source side) of the NAND string, example electrons 845 and 849 move toward the source line. Electron 845 is generated at the GIDL generation transistor 802 and electron 849 is generated at a junction of the memory cell 865 in the channel region 867. Also, at the source side, example holes including a hole 847 move away from the source line and hole 847 is generated at a junction of the memory 865 in the channel region 867 and can tunnel into the CTL region 868 as indicated by arrow 848.

Figure 8:
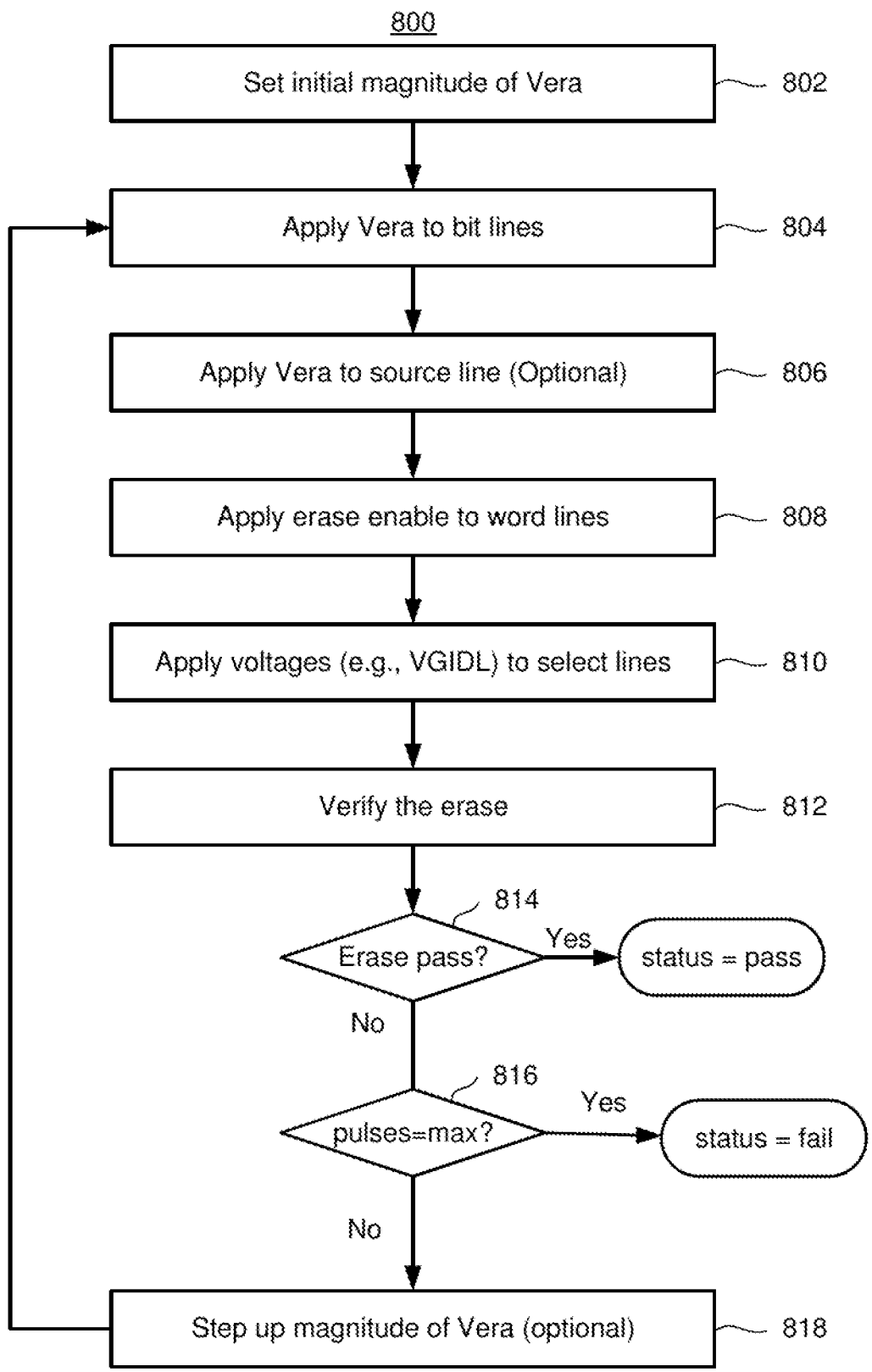
FIG. 8 is a flowchart describing one embodiment of a process for erasing memory cells.

FIG. 8 is a flowchart describing one embodiment of a process 800 for erasing memory cells. The process 800 may be used to erase an erase block of NAND memory cells. In one embodiment, the process 800 may be used to erase an entire block of NAND memory cells. In one embodiment, the process 600 may be used to erase a sub-block of the block of NAND memory cells. One type of sub-block are the sub-blocks selected by different drain side select lines such as in FIG. 4E. For example, the sub-block selected by SGDT0-s0, SGDT1-s0, SGD0-s0, and SGD1-s0 (more briefly referred to as SGD-s0) may be erased independent of the other four sub-blocks. Thus, in the example in FIG. 4E, there may be five sub-blocks selected by the respective SGDs. In an embodiment, system control logic 260 performs process 800 in response to a command from the memory controller 120. Process 800 describes a double sided erase in which an erase voltage (Vera) is applied at both ends of NAND strings (e.g., bit lines and source line). However, a single sided erase is also possible in which the erase voltage (Vera) is applied to only one end (e.g., bit line or source line) of the NAND strings. The steps of process 800 are described in a certain order to facilitate explanation. However, the steps could occur in a different order. Also, some of the steps may occur concurrently.

Step 802 includes setting an initial magnitude of an erase voltage (Vera). The initial Vera may have a relatively large magnitude such as, for example, 20V. In some embodiment, the erase voltage is applied as a voltage pulse (erase voltage pulse) Step 804 includes applying Vera to bit lines connected to the NAND strings in the erase block. Step 806 includes applying Vera to a source line connected to the NAND strings in the erase block. Step 806 is optional in that the erase could be a single sided erase in which Vera is provided only from the bit lines. In an alternative embodiment, Vera is provided only from the source line (not from the bit lines). Step 808 includes applying an erase enable voltage to the word lines in the erase block (e.g., the selected word lines connected to the selected memory cells). An erase enable voltage applied to a memory cell's control gate will enable erase of that cell if the erase voltage (e.g., Vera) is in the channel of that cell. In other words, the erase occurs as a result of the magnitude (and polarity) of the voltage between the control gate and the channel. In one embodiment, the erase enable voltage is 0V. Thus, a voltage of about 20V may occur between the channel and the control gate. Step 810 includes applying a voltage (herein referred to as a "GIDL voltage" or Vgidl) to select lines (e.g., SGD, SGS). The GIDL voltage allows Vera to pass to the channels of the NAND strings. The GIDL voltage has a suitable magnitude that, in combination with Vera, will generate a GIDL current. In an embodiment, GIDL current is generated at both the source end and the drain end of the NAND strings to pass the erase voltage to the channels of the memory cells. In an embodiment, GIDL current is generated at only one end of the NAND strings to pass the erase voltage to the channels of the memory cells. The GIDL current will be generated at the end of the NAND strings to which Vera is applied.

Thus, the erase of a memory cell includes applying an erase enable voltage (e.g., 0V) to the control gate of the memory cell while applying an erase voltage (e.g., about 20V) to a channel or body of the memory cell. An erase voltage is defined herein as a voltage applied to a channel or body of a memory cell that will erase the memory cell providing that the erase enable voltage is also applied to a control gate of that memory cell. A memory cell that has the erase voltage applied to its channel (body) may be inhibited from erase by applying an erase inhibit voltage to its control gate. An erase inhibit voltage (applied to a memory cell control gate) is defined herein as a voltage that will inhibit erase of a memory cell despite the erase voltage being applied to the channel (body) of that memory cell.

After steps 804-810 are performed, an erase verify may be performed in step 812. The erase verify may apply for example VeV (See FIG. 5C) to each data word line in the erase block. If all memory cells in the erase block on a given NAND string have a Vt below VeV then the NAND string will conduct a significant current. In some embodiments, if a NAND string passes, erase of the NAND string may end at this point. Step 814 is a determination of whether erase is complete (status=pass) because all or enough NAND strings passes erase verify. If not, the system determines (in step 816) whether the maximum number of erase voltage pulses have been applied. If so, then the erase process has failed. If less than the maximum number of erase voltage pulses have been applied then the magnitude of the erase voltage (Vera) may optionally be increased in step 818 and steps 804-816 are repeated.

As mentioned above, it is desired to be able to securely delete a file from the non-volatile memory such that hackers cannot recover the data. If a block is storing more than one file, then performing the process of FIG. 8 to erase an entire block will erase the file that is desired to be erase and other files. To prevent the other files from also being deleted, they can be moved to a new location prior to the erase process of FIG. 8; however, that slows down the erase process, reducing system performance. When a file is to be securely updated, such that hackers cannot access the old data, the updated new data is rewritten elsewhere instead of the original physical location. The data in original physical location become obsolete and marked by memory controller 120 as invalid. If this original data is sensitive data, although it isn't visible by a host or by user, there is risk that this data can be reconstructed and retrieved since the stale data is still physically existing in the original physical location. To remedy the above-described issues, secure erase process is proposed that achieves single file sanitization.

FIG. 9 is a flow chart of one embodiment of an erase process 900 that achieves single file sanitization. The process of FIG. 9 can be performed by any one of the one or more control circuits discussed above. The process of FIG. 9 can be performed entirely by a control circuit on memory die 200 (see FIG. 2A) or entirely by a control circuit on integrated memory assembly 207 (see FIG. 2B). In one example, the process of FIG. 9 is performed by or at the direction of state machine 262, using other components of System Control Logic 260, Column Control Circuitry 210 and Row Control Circuitry 220. In another embodiment, the process of FIG. 9 is performed by and/or at the direction of memory controller 120 using the above-mentioned circuits on memory die 200 or integrated memory assembly 207. The process of FIG. 9 is performed on a memory implementing any of the structures depicted in FIGS. 1-4F.

In step 902 of FIG. 9, the control circuit receives a request to perform a process that includes securely erasing a single file from a programmed block. For example, a command can be received to securely erase a single file or a command can be received to securely update a single file. In step 904, the control circuit erases the file from the block without moving or disturbing other programmed data in the block. In one embodiment, the block is a programmed block that is storing multiple files, only one of which is being erased and the remaining files remain intact with no damage or change. In one embodiment, the control circuit is configured to erase the file from the block by performing GIDL erase for some memory cells of the block (e.g., a first page) connected to a common word line while preventing GIDL erase for other memory cells of the block (e.g., a second page) connected to the common word line. In one embodiment, the control circuit is configured to erase the file from the block by performing GIDL erase for one memory cell of a selected NAND string while preventing GIDL erase for other memory cells of the selected NAND string.

The erasing of the file is a partial block erase in that only a subset of the memory cells of the block are subjected to erase conditions. For many prior art systems, the unit of erase is a block so that performing an erase process (e.g., FIG. 8) subjects all memory cells of the block to erase conditions (even memory cells that are already in the erased data state). In one embodiment of the proposed technology, one page of memory cells are erased. In another embodiment, multiple pages of memory cells are erased, but not the entire block. In another embodiment, a portion of a page is erased (e.g., one or more segments).

FIG. 10 is a flow chart of one embodiment of an erase process 1000 that achieves single file sanitization. The process of FIG. 10 is an example implementation of the process of FIG. 9. The process of FIG. 10 can be performed by any one of the one or more control circuits discussed above. The process of FIG. 10 can be performed entirely by a control circuit on memory die 200 (see FIG. 2A) or entirely by a control circuit on integrated memory assembly 207 (see FIG. 2B), rather than by memory controller 120. In one example, the process of FIG. 10 is performed by or at the direction of state machine 262, using other components of System Control Logic 260, Column Control Circuitry 210 and Row Control Circuitry 220. In another embodiment, the process of FIG. 10 is performed by and/or at the direction of memory controller 120 using the above-mentioned circuits on memory die 200 or integrated memory assembly 207. The process of FIG. 10 is performed on a memory implementing any of the structures depicted in FIGS. 1-4F.

Step 1002 of FIG. 10 includes receiving a request to perform a process that includes erasing a single file from a programmed block. The programmed block resides in a non-volatile memory that includes word lines connected to memory cells. The programmed block is organized into pages such that multiples pages of data are stored by memory cells connected to a same word line. Step 1004 includes receiving one or more logical addresses for the file. Step 1006 includes converting the logical addresses for the file to physical addresses in the non-volatile memory. Each physical address identifies a portion of a page (e.g., a segment). In one embodiment, step 1006 including using one or more L2P tables to convert the logical addresses received in step 1004 to physical addresses in the memory. Step 1008 includes determining that the file to be deleted spans more than one page based on the physical addresses. In one embodiment, a page includes four segments each having its own physical address. If the physical addresses determined in step 1006 are in more than one page, then the file to be deleted spans more than one page. Step 1010 includes issuing a separate page erase command for each page occupied by the file such that only the intended file is unrecoverably erased and no other data in the block is moved or disturbed. In one embodiment, step 1010 includes performing a separate page erase operation for each page occupied by the file such that only the file is unrecoverably erased and no other data in the first block is moved or disturbed.

FIG. 11 is a flow chart of one embodiment of an erase process 1100 that achieves single file sanitization. The process of FIG. 11 is an example implementation of the process of FIG. 9 and/or the process of FIG. 10. The process of FIG. 11 can be performed by any one of the one or more control circuits discussed above. In one embodiment, the process of FIG. 11 is performed by memory controller 120. In alternative embodiments, the process of FIG. 11 can be performed entirely by a control circuit on memory die 200 (see FIG. 2A) or entirely by a control circuit on integrated memory assembly 207 (see FIG. 2B), rather than by memory controller 120. In one example, the process of FIG. 11 is performed by or at the direction of state machine 262, using other components of System Control Logic 260, Column Control Circuitry 210 and Row Control Circuitry 220.

Step 1102 of FIG. 11 includes receiving a request to perform a process that includes erasing a single file from a programmed block. The programmed block resides in a non-volatile memory that includes word lines connected to memory cells. The programmed block is organized into pages such that there are multiples pages of memory cells connected to a same word line. Step 1104 includes receiving one or more logical addresses for the file. Step 1106 includes converting the logical addresses for the file to physical addresses in the non-volatile memory. Step 1108 includes determining that the file to be deleted spans more than one page based on the physical addresses. In one embodiment, a page includes four segments each having its own physical address. If the physical addresses determined in step 1006 are in more than one page, then the file to be deleted spans more than one page.

If the file does not span more than one page (step 1110), then in step 1112 the memory controller 120 (or other control circuit) issues a page erase command to the memory die 200 or control die 211. The page erase command includes the first physical address for the page. In other embodiments, the page erase command includes any of the physical addresses for the page, or all of the physical addresses for the page. In step 1114, the memory die 200 (or control die 211 and memory die 202) perform the page erase for the single page addressed by the physical address provided in step 1112. At this point, the single file sanitization has completed (1116).

If the file does span more than one page (step 1110), then in step 1122 the memory controller 120 (or other control circuit) issues a page erase command to the memory die 200 or control die 211. The page erase command includes the first physical address for the page. In other embodiments, the page erase command includes any of the physical addresses for the page, or all of the physical addresses for the page. Since the file spans more than one page, the physical address provided is only for one of the pages. If this is the first loop of steps 1122-1128, then a physical address for the first page is provided. In step 1124, the memory die 200 (or control die 211 and memory die 202) perform the page erase for the single page addressed by the physical address provided in step 1122. If the page just erased was the last page that needs to be erased for the file (step 1126), then the single file sanitization has completed (1116). If there are more pages to be erased for the file (step 1126), then the process loops back to step 1122 to issues a page erase command with one or more physical addresses for the next page that needs to be erased. Steps 1110-1128 are an example implementation of step 1010 of FIG. 10.

Step 1112 and 1122 comprise issuing a page erase command. One example of a page erase command, referred to as CMD XX, is:

60h-Address (5cyc)-XXh⇒Busy (tERASE)→Ready

In command sequence CMD 60-CMD XX combination, the address cycles are 5 cycles instead of 3 cycles of prior erase commands. The extra 2 address cycles are used for column (e.g. page) address inputs. With this 2 bytes column (e.g. page) address inputs, a secure erase starting address can be specified with one physical page range. The data at the starting address and subsequent addresses for one physical page will be erased.

Another example of a page erase command, referred to as CMD YY, is:

60h-Address (5cyc)-Data in-YYh=>Busy (tERASE)→Ready

In this command sequence CMD 60-CMD YY combination, the address cycles are also 5 cycles. However, compared CMD XX, there is a "Data in" portion. Within the "Data in", there is one bit of data for each memory cell of the page being erased such that a '0' in "Data in" indicates to inhibit erase for the corresponding memory cell and a '1' indicates to allow erase for the corresponding memory cell. This command gives more flexibility to the user as the user gets to choose which bits of the page get erased and which bits do not get erased. In this manner, the page erase command includes an indication of which bits of the page to erase and which bits not to erase.

FIG. 12 is a flow chart of one embodiment of an erase process 1200 that achieves single file sanitization. The process of FIG. 12 is performed by any one of the one or more control circuits discussed above. In one embodiment, the process of FIG. 12 is performed by entirely by a control circuit on memory die 200 (see FIG. 2A) or entirely by a control circuit on integrated memory assembly 207 (see FIG. 2B). In one example, the process of FIG. 12 is performed by or at the direction of state machine 262, using other components of System Control Logic 260, Column Control Circuitry 210 and Row Control Circuitry 220.

In step 1202, the memory die 200 or integrated memory assembly 207 receives a page erase command. This page erase command is the command sent by memory controller 120 in step 1112 or step 1122. Therefore, step 1202 is performed in response to step 1112 or step 1122. Thus, the process of FIG. 12 is performed in response to the process of FIG. 11. In step 1204, the magnitude of the initial erase voltage pulse is set. Step 1204 is analogous to step 802 of FIG. 8. In step 1206, it is determined whether the erase command is for all bits of the page or only for individually selected bits. For example, if the erase command is CMD XX, then the erase command is for all bits of the page and the process continues at step 1208; and if the erase command is CMD YY, then the erase command is for individually selected bits of the page and the process continues at step 1230.

In step 1208, the memory die 200 or integrated memory assembly 207 applies the erase voltage to all bits of the page. Step 1208 is analogous to steps 804-810 of FIG. 8. In step 1210, the memory die 200 or integrated memory assembly 207 performs erase verify for all bits of the page. Step 1210 is analogous to step 812 of FIG. 8. If all or a sufficient number of memory cells or NAND strings pass erase verify (step 1210), the erase process has completed successfully. If not, the system determines (in step 1212) whether the maximum number of erase voltage pulses have been applied. If so, then the erase process has failed. If less than the maximum number of erase voltage pulses have been applied then the magnitude of the erase voltage pulse may optionally be increased in step 1214 and steps 1208-1212 are repeated.

In step 1230, the memory die 200 or integrated memory assembly 207 applies the erase voltage to selected bits of the page. Step 1230 is analogous to steps 804-810 of FIG. 8, except that the erase voltage pulse is only applied to NAND strings (e.g., via the bit lines) having memory cells selected to be erased. In step 1232, the memory die 200 or integrated memory assembly 207 performs erase verify for the selected bits of the page. Step 1210 is analogous to step 812 of FIG. 8. If all or a sufficient number of memory cells or NAND strings pass erase verify (step 1234), the erase process has completed successfully. If not, the system determines (in step 1236) whether the maximum number of erase voltage pulses have been applied. If so, then the erase process has failed. If less than the maximum number of erase voltage pulses have been applied then the magnitude of the erase voltage pulse may optionally be increased in step 1238 and steps 1230-1236 are repeated.

Figure 13:
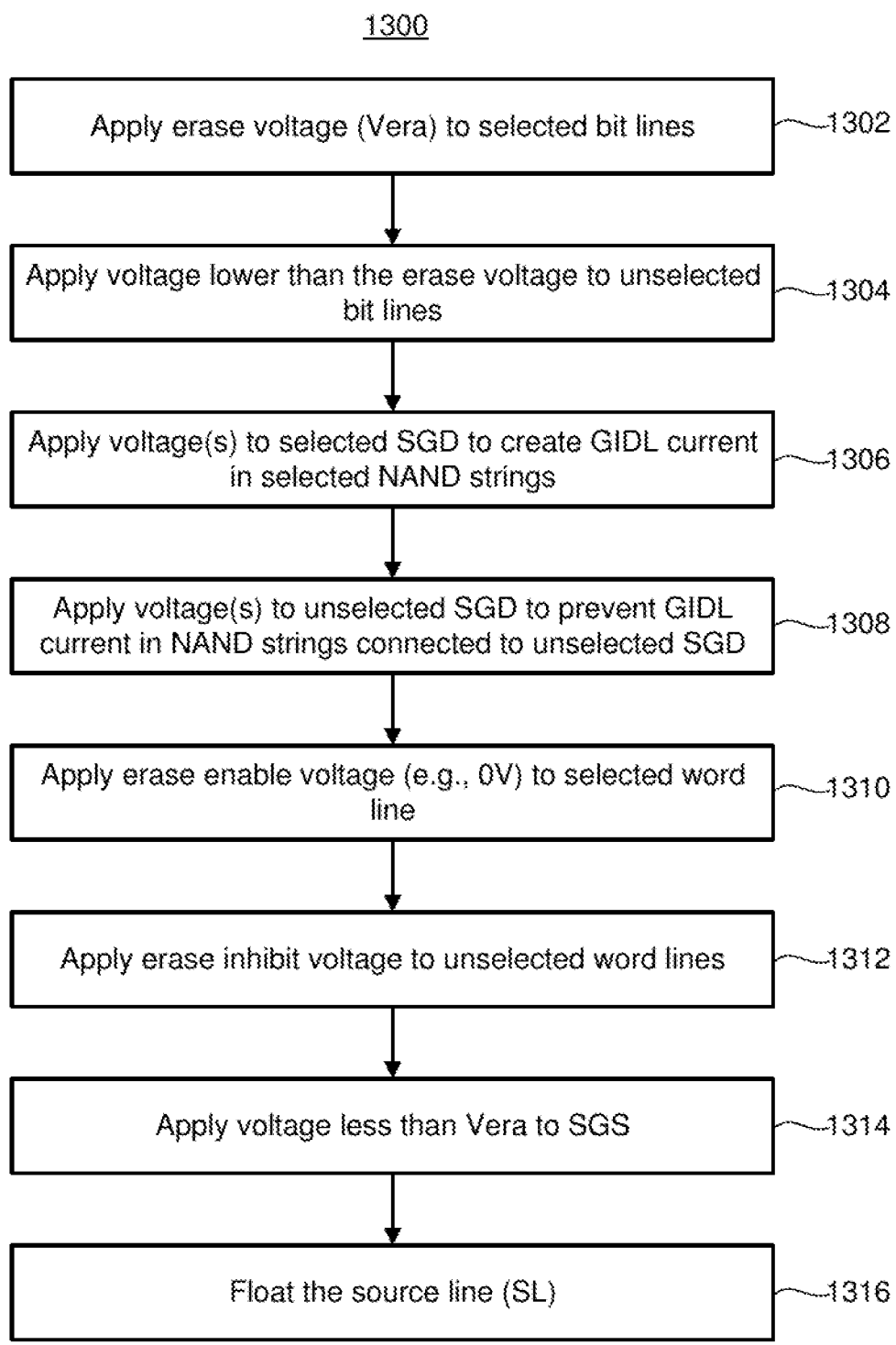
FIG. 13 is a flowchart of one embodiment of a process of bit-level erase in 3D NAND.
Figure 14:
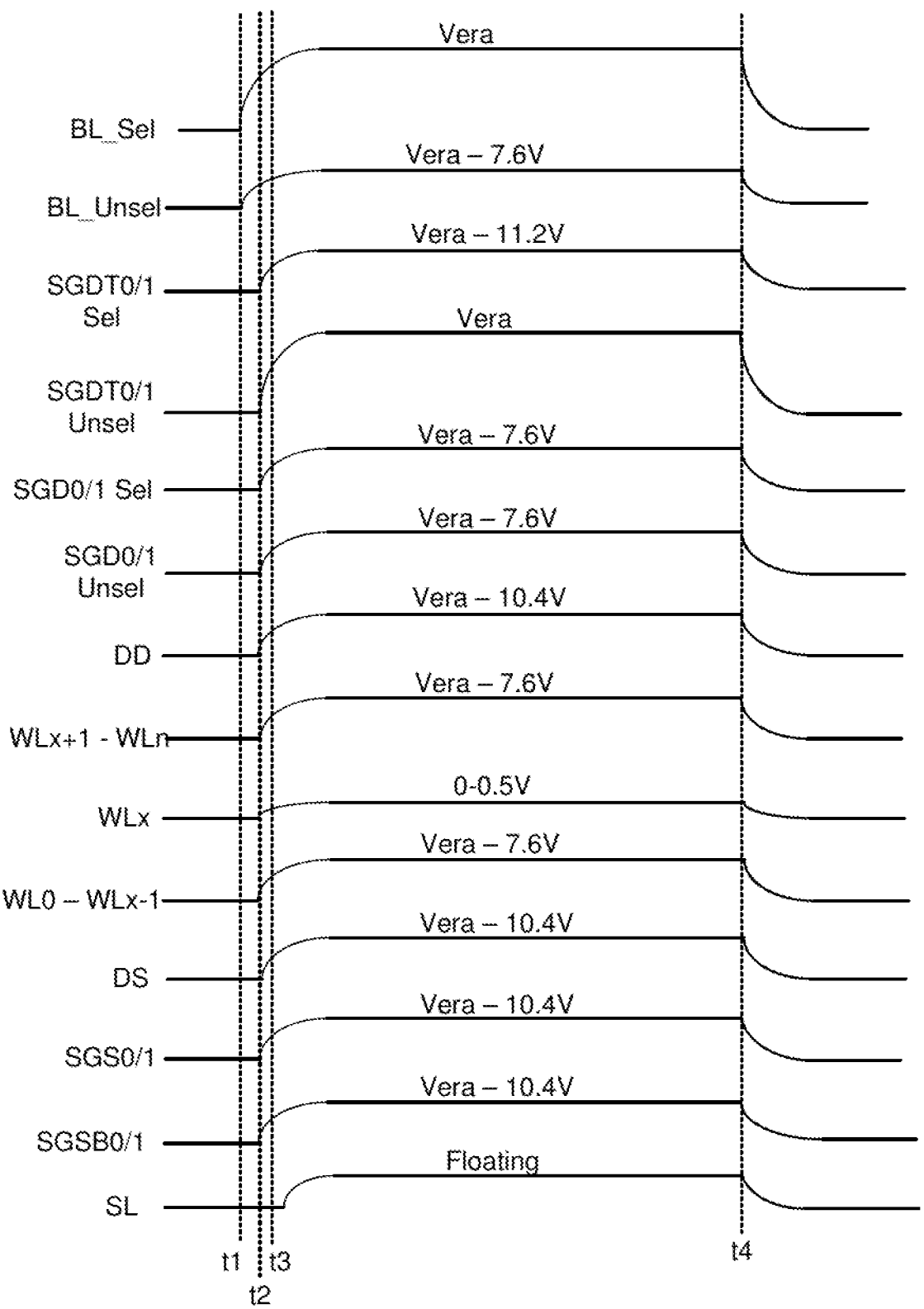
FIG. 14 is a timing diagram of voltages applied to the memory structure in one embodiment of a post-program bit-level erase in 3D NAND.

FIG. 13 is a flowchart of one embodiment of a process 1300 of bit-level erase in 3D NAND. The process 1300 may be used in step 1208 or step 1230 of process 1200 of FIG. 12. The process of FIG. 13 is performed, at the direction of state machine 262, by the circuits of memory die 200 (embodiment of FIG. 2A) or control die 211 (embodiment of FIG. 2B). FIG. 14 is a timing diagram of voltages applied to the memory structure in one embodiment of the process of FIG. 13. The timing diagram will be referred to when describing process 1300. The steps of process 1300 may be performed in a different order than depicted in FIG. 13. Also some steps could be performed concurrently.

Step 1302 includes applying an erase voltage (Vera), such as an erase voltage pulse, to selected bit lines. A selected bit line is a bit line that is connected to a NAND string having a memory cell that is to be erased. The memory cells to be erased are connected to the selected word line (but not all memory cells connected to the selected word line will be erased). For CMD XX, all bit lines in the selected page will receive the erase voltage (as per step 1208). For CMD YY, only bit lines in the selected page that correspond to a "1" in the "Data in" will receive the erase voltage (as per step 1230).

Step 1304 includes applying a voltage that is lower than the erase voltage to the unselected bit lines. An unselected bit line is a bit line that is connected to NAND strings for which no memory cells are to be erased. For CMD YY, bit lines corresponding to a "0" in the "Data in" are unselected bit lines. For CMD YY and CMD XX, bit lines for pages other than the page being erased are unselected bit lines. In this manner, the control circuit is configured to erase the file from by performing GIDL erase for some memory cells of the block connected to a common word line while preventing GIDL erase for other memory cells of the block connected to the common word line. FIG. 14 shows that at time t1 the voltage on the selected bit lines (BL_Sel) begins to increase to Vera. Also, at time t1 the voltage on the unselected bit lines (BL_Unsel) begins to increase to Vera-7.6 volts.

Step 1306 includes applying voltage(s) to the selected SGD to create a GIDL current in the selected NAND strings (a selected NAND string is connected to a selected bit line and is also in the selected region). With reference to FIG. 14, at t2 the voltage on SGDT0/1 Sel begins to increase to Vera-11.2V. Also, at t2 the voltage on SGD0/1 Sel begins to increase to Vera-7.6V. The combination of the voltages applied to the control gates of the selected SGD transistors and the selected bit lines will generate a GIDL current in the selected NAND strings. In this example, the SGD layers have four layers (see FIGS. 4C and 4E). In this example, Vera-11.2V is applied to the top two SGD lines (SGDT0, SGDT1). The next two lower SGD lines (SGD0, SGD1) each receive Vera-7.6V. In other embodiments, there will be a different number of SGD layers. Therefore, it will be understood by one of ordinary skill in the art that the generation of GIDL current is not limited to the example voltages in FIG. 14.

Step 1308 includes applying voltage(s) to the unselected SGD to prevent a GIDL current in the unselected NAND strings connected to the unselected SGD. Note that the NAND strings connected to the unselected SGD are in unselected regions. With reference to FIG. 14, at t2 the voltage on SGDT0/1 Unsel begins to increase to Vera. Also, at t2 the voltage on SGD0/1 Unsel begins to increase to Vera-7.6V. The combination of the voltages applied to the control gates of the unselected SGD transistors and either the selected bit lines or the unselected bit lines will not generate a GIDL current in the unselected NAND strings connected to the unselected SGD. For example, the drain to gate voltage difference between the voltage to and BL_sel and SGDT0/1 Unsel is given by: Vera-Vera=0V. The drain to gate voltage difference between the voltage to and BL_unsel and SGDT0/1 Unsel is given by: (Vera-7.6V)−Vera=−7.6V. Neither of these two conditions will create GIDL current in the unselected SGDT0/1. In one embodiment, the SGD layers have four layers (see FIGS. 4C and 4E). In this example, Vera is applied to the top two unselected SGD lines (SGDT0, SGDT1). The next two lower SGD lines (SGD0, SGD1) each receive Vera-7.6V. The voltages applied to the control gates of unselected SGD0, SGD1 will not generate GIDL current.

Additionally, unselected NAND strings that are connected to the selected SGD will be inhibited from erase. These unselected NAND strings are in the selected region, but are connected to unselected bit lines. The combination of voltages applied to the unselected bit lines and the selected SGD will not generate a GIDL current in these unselected NAND strings. For example, the bit line to SGDT0/1 voltage for such NAND strings will be given by: (Vera-7.6V)−(Vera-11.2V)=3.8V. A drain to gate voltage of 3.8V will be too low to generate a GIDL current. Furthermore, the voltage applied to the selected SGD0/1 will not result in GIDL current for such unselected NAND strings.

Referring again to FIG. 13, step 1310 includes applying an erase enable voltage (e.g., 0V to 0.5V) to the selected word line (WLx) associated with the page being erased. Step 1312 includes applying an erase inhibit voltage to the unselected word line (WLx+1 to WLn, and WL0 to WLx−1). Referring to FIG. 14 at t3, 0.5V is applied to WLx. Also, Vera-7.6V is applied to the unselected word lines (WLx+1 to WLn, and WL0 to WLx−1). Also, Vera-10.4V is applied to the dummy word lines (e.g., DD0, DD1, DS1, DS0). In this manner, the control circuit is configured (in one embodiment) to erase the file by performing GIDL erase for one memory cell of a selected NAND string while preventing GIDL erase for other memory cells of the selected NAND string.

The erase enable voltage (e.g., 0V to 0.5V) to the selected word line (WLx) will enable erase of selected memory cells, which may have a voltage of approximately Vera passed to their channels. Some of the unselected memory cells to be inhibited will have the erase enable voltage applied to their control gates. For example, a memory cell could be connected to the selected word line but also be on a NAND string connected to an unselected BL. Such an unselected memory cell will not have Vera passed to its channel (as a result of no GIDL generation for that unselected NAND string). The voltage across this memory cell will not be sufficient to erase the cell (or to program the cell). Some unselected memory cells will be on a selected NAND string, but will be connected to an unselected word line. Such cells may have a channel to control gate voltage of about: Vera−(Vera-7.6V)=7.6V. The channel to control gate voltage of 7.6V will not erase such as unselected memory cell.

Referring again to FIG. 13, step 1314 includes applying a voltage lower than Vera to SGS. Step 1316 includes floating the source line (SL). Referring to FIG. 14, the voltages to SGS0/1 and SGSB0/1 are both raised to Vera-10.4 V at t2. The source line voltage is floated at t3. At t4 the voltages on the various control lines are brought back down.

A non-volatile memory system has been disclosed that can permanently erase a single file from a block of non-volatile memory cells without moving or disturbing other programmed data in the same block.

One embodiment includes a non-volatile storage apparatus, comprising: a memory structure comprising a plurality of non-volatile memory cells arranged in blocks; and a control circuit connected to the memory structure, the control circuit is configured to erase a file from a first block without moving or disturbing other programmed data in the first block.

One embodiment includes a method, comprising: receiving a request to perform a process that includes erasing a single file from a programmed block, the programmed block resides in a non-volatile memory that includes word lines connected to memory cells, the programmed block is organized into pages of data such that multiples pages of data are stored by memory cells connected to a same word line; receiving logical addresses for the file; converting the logical addresses for the file to physical addresses in the non-volatile memory, each physical address identifies a portion of a page; determining that the file spans more than one page based on the physical addresses; and issuing a separate page erase command for each page occupied by the file such that only the file is unrecoverably erased and no other data in the block is moved or disturbed.

One embodiment includes a non-volatile storage apparatus, comprising: a plurality of memory cells arranged in blocks; and a control circuit connected to the memory cells, the control circuit is configured to program data into the blocks, the control circuit includes means for permanently erasing a single file from a programmed block without moving or disturbing other programmed data in the block.

In one embodiment, the means for permanently erasing a single file from a programmed block without moving or disturbing other programmed data in the block comprises one of or a combination of memory controller 120, system control logic 260, state machine 262, power control 264, column control circuitry 210, row control circuitry 220, an FPGA, an ASIC, a processor and/or an integrated circuit. In one embodiment, the means for permanently erasing a single file from a programmed block without moving or disturbing other programmed data in the block performs one or more of the processes of FIGS. 9, 10, 11, and/or 12. Additionally, some embodiments of the means for permanently erasing a single file from a programmed block without moving or disturbing other programmed data in the block performs the processes of FIGS. 13 and 14 for applying the erase voltage.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
a memory structure comprising a plurality of non-volatile memory cells arranged in blocks and word lines connected to the memory cells; and
a control circuit connected to the memory structure, the control circuit is configured to erase a file from a first block without moving or disturbing other programmed data in the first block by performing erase for some memory cells of the block connected to a common word line while preventing erase for other memory cells of the block connected to the common word line.

2. The non-volatile storage apparatus of claim 1, wherein: the first block is a programmed block that is storing multiple files.

3. The non-volatile storage apparatus of claim 1, wherein: the blocks are organized into pages; and
the control circuit is configured to determine whether the file spans more than one page and perform a separate page erase operation for each page.

4. The non-volatile storage apparatus of claim 1, wherein: the memory structure comprises word lines connected to the memory cells and the control circuit; and
the blocks are divided into pages such that multiples pages are stored by memory cells connected to a same word line.

5. The non-volatile storage apparatus of claim 4, wherein: the control circuit is configured to determine whether the file spans more than one page and issue a separate page erase command for each page that the file spans.

6. The non-volatile storage apparatus of claim 4, wherein: the control circuit is configured to determine whether the file spans more than one page and perform a separate page erase for each page that the file spans.

7. The non-volatile storage apparatus of claim 4, wherein the control circuit is configured to erase the file from the first block by:
receiving a request to perform a process that includes erasing the file from the first block;
receiving logical addresses for the file;
converting the logical addresses for the file to physical addresses in the memory structure, each physical address identifies a portion of a page;
determining that the file spans more than one page based on the physical addresses; and
issuing a separate page erase command for each page occupied by the file such that only the file is unrecoverably erased and no other data in the first block is moved or disturbed.

8. The non-volatile storage apparatus of claim 7, wherein: the request to perform a process includes writing new data for the file in a new location and erasing the file from the first block.

9. The non-volatile storage apparatus of claim 7, wherein: the request to perform a process requests erasing the file from the first block.

10. The non-volatile storage apparatus of claim 7, wherein:
the page erase command includes an indication of which bits of the page to erase and which bits not to erase.

11. The non-volatile storage apparatus of claim 7, wherein:
each page is addressed by four different physical addresses.

12. The non-volatile storage apparatus of claim 1, wherein the control circuit is configured to erase the file from the first block by:
receiving a request to perform a process that includes erasing the file from the first block, the first block is arranged into multiple pages;
receiving logical addresses for the file;
converting the logical addresses for the file to physical addresses in the memory structure, each physical address identifies a portion of a page;
determining that the file spans more than one page based on the physical addresses; and
performing a separate page erase operation for each page occupied by the file such that only the file is unrecoverably erased and no other data in the first block is moved or disturbed.

13. The non-volatile storage apparatus of claim 1, wherein the control circuit is configured to erase the file from the first block by:
receiving a request to perform an erase operation;
receiving an address for a page in the first block;
receiving data indicating which bits of the page should be erased and which bits of the page should not be erased; and
erasing bits of the page that should be erased and while not erasing bits of the page that should not be erased based on the received data.

14. The non-volatile storage apparatus of claim 1, wherein:
the memory structure comprises word lines connected to the memory cells and the control circuit; and
the control circuit is configured to erase the file from the first block by performing GIDL erase for some memory cells of the block connected to a common word line while preventing GIDL erase for other memory cells of the block connected to the common word line.

15. The non-volatile storage apparatus of claim 1, wherein:
the memory cells are arranged as NAND stings; and
the control circuit is configured to erase the file from the first block by performing GIDL erase for one memory cell of a selected NAND string while preventing GIDL erase for other memory cells of the selected NAND string.

16. A method, comprising:

receiving a request to perform a process that includes erasing a single file from a programmed block, the programmed block resides in a non-volatile memory that includes word lines connected to memory cells, the programmed block is organized into pages such that multiples pages are stored by memory cells connected to a same word line;

receiving logical addresses for the file;

converting the logical addresses for the file to physical addresses in the non-volatile memory, each physical address identifies a portion of a page;

determining that the file spans more than one page based on the physical addresses; and issuing a separate page erase command for each page occupied by the file such that only the file is unrecoverably erased and no other data in the block is moved or disturbed.

17. The method of claim 16, wherein:

the memory cells are arranged as NAND stings; and the separate page erase commands cause GIDL erase to be performed for one memory cell of a selected NAND string while preventing GIDL erase for other memory cells of the selected NAND string.

18. The method of claim 16, wherein:

each separate page erase command includes an indication of which bits of the page to erase and which bits not to erase.

19. The method of claim 16, wherein:

the programmed block is storing multiple files prior to the issuing a separate page erase command for each page occupied by the file.

20. A non-volatile storage apparatus, comprising:

a plurality of memory cells arranged in blocks;

word lines connected to the memory cells, the blocks are divided into pages such that multiples pages are stored by memory cells connected to a same word line; and a control circuit connected to the memory cells and the word lines, the control circuit is configured to program data into the blocks, the control circuit includes means for permanently erasing a single file from a programmed block without moving or disturbing other programmed data in the block by determining whether the file spans more than one page and performing a separate page erase for each page that the file spans.

* * * * *